US009200364B2

(12) United States Patent
Ito

(10) Patent No.: US 9,200,364 B2
(45) Date of Patent: Dec. 1, 2015

(54) FILM FORMING APPARATUS, FILM FORMING METHOD, METHOD FOR OPTIMIZING ROTATIONAL SPEED, AND STORAGE MEDIUM

(75) Inventor: Shozo Ito, Oshu (JP)

(73) Assignee: Tokyo Electron Limited, Minato-Ku (JP)

( * ) Notice: Subject to any disclaimer, the term of this patent is extended or adjusted under 35 U.S.C. 154(b) by 339 days.

(21) Appl. No.: 13/579,299

(22) PCT Filed: Mar. 18, 2011

(86) PCT No.: PCT/JP2011/056546
§ 371 (c)(1),
(2), (4) Date: Aug. 16, 2012

(87) PCT Pub. No.: WO2011/115250
PCT Pub. Date: Sep. 22, 2011

(65) Prior Publication Data
US 2012/0315394 A1 Dec. 13, 2012

(30) Foreign Application Priority Data

Mar. 19, 2010 (JP) ................. 2010-063928
Nov. 19, 2010 (JP) ................. 2010-259567

(51) Int. Cl.
*C23C 16/52* (2006.01)
*C23C 16/455* (2006.01)
(Continued)

(52) U.S. Cl.
CPC ........... *C23C 16/345* (2013.01); *C23C 16/4584* (2013.01); *C23C 16/45525* (2013.01);
(Continued)

(58) Field of Classification Search
CPC ............ C23C 16/345; C23C 16/45578; C23C 16/4584; C23C 16/45546; C23C 16/515; C23C 16/45525; C23C 16/507; C23C 16/4412; C23C 16/448; C23C 16/4481; C23C 16/4482; C23C 16/4485; C23C 16/455; C23C 16/45502; C23C 16/4551; C23C 16/52
See application file for complete search history.

(56) References Cited

U.S. PATENT DOCUMENTS 5,916,365 A 6/1999 Sherman
7,365,005 B1 4/2008 Gadgil
(Continued)

FOREIGN PATENT DOCUMENTS

JP 08-181076 A1 7/1996
JP 2003-502878 A1 1/2003
(Continued)

OTHER PUBLICATIONS

International Search Report dated Jun. 21, 2011 (with English translation).

Primary Examiner — Jeffrie R Lund
(74) Attorney, Agent, or Firm — Burr & Brown, PLLC

(57) ABSTRACT

A film forming apparatus for forming a film on an object includes: a processing container; gas supply means, having gas jet ports, respectively; a holding means for holding the object; a drive mechanism for moving the holding means relative to the gas jet ports; and a control means which, when repeating P times a cycle, consisting of a supply period for supplying a gas and a supply stop period during which the supply of the gas is stopped, performs control so that as viewed from the center of the object, a gas supply starting position is sequentially shifted in the circumferential direction of the object for every cycle in such a manner that the entire circumference of the object to be processed is divided into K segments (K=P), K being an arbitrary division number, and the gas supply starting position is shifted by one segment for every cycle.

6 Claims, 12 Drawing Sheets

(51) Int. Cl.
  *C23C 16/515* (2006.01)
  *C23C 16/507* (2006.01)
  *C23C 16/458* (2006.01)
  *C23C 16/34* (2006.01)

(52) U.S. Cl.
  CPC ..... *C23C16/45546* (2013.01); *C23C 16/45578* (2013.01); *C23C 16/507* (2013.01); *C23C 16/515* (2013.01); *C23C 16/52* (2013.01)

(56) References Cited

U.S. PATENT DOCUMENTS

| | | |
|---|---|---|
| 2004/0129212 A1 | 7/2004 | Gadgil et al. |
| 2004/0224504 A1* | 11/2004 | Gadgil ............................ 438/680 |
| 2006/0150905 A1* | 7/2006 | Sakai et al. ................... 118/715 |
| 2008/0153309 A1 | 6/2008 | Sakai et al. |
| 2008/0160214 A1 | 7/2008 | Sakai et al. |
| 2010/0068893 A1* | 3/2010 | Kato et al. ..................... 438/758 |
| 2010/0136260 A1 | 6/2010 | Matsunaga et al. |
| 2012/0315394 A1* | 12/2012 | Ito .............................. 427/255.5 |

FOREIGN PATENT DOCUMENTS

| | | |
|---|---|---|
| JP | 2003-508932 A1 | 3/2003 |
| JP | 2004-006801 A1 | 1/2004 |
| JP | 2004-134466 A1 | 4/2004 |
| JP | 2008-263224 A1 | 10/2008 |
| JP | 2009-239304 A1 | 10/2009 |
| JP | 2010-090413 A1 | 4/2010 |
| WO | 01/17692 A1 | 3/2001 |
| WO | 2005/088692 A1 | 9/2005 |

* cited by examiner

FILM FORMING APPARATUS, FILM FORMING METHOD, METHOD FOR OPTIMIZING ROTATIONAL SPEED, AND STORAGE MEDIUM

BACKGROUND OF THE INVENTION

1. Field of the Invention

The present invention relates to a film forming apparatus, a film forming method, a method for optimizing a rotational speed and a storage medium which are for forming a multi-layer film of a reaction product by repeating the cycle of supplying at least one reactive gas to a surface of a substrate, such as a semiconductor wafer.

2. Description of Related Art

As a film forming method for use in a semiconductor manufacturing process, a film forming process is known which involves a repetition of a processing cycle of supplying a first reactive gas to a surface of a semiconductor wafer (hereinafter also referred to simply as "wafer") as a substrate in a vacuum atmosphere to adsorb the gas onto the wafer surface, and then switching the gas to a second reactive gas to form an atomic or molecular layer or layers by a reaction between the first and second gases. By repeating the cycle a number of times, a multi-layer film of the reaction product can be formed on the substrate. Such a process, e.g. so-called ALD (atomic layer deposition) or MLD (molecular layer deposition), is capable of controlling with high accuracy the thickness of a film by the number of processing cycles and is good in the quality of the in-plane uniformity of the film, and therefore can effectively deal with semiconductor devices which are becoming thinner.

Such a film forming method may preferably be used for the formation of a high-dielectric constant film e.g. as a gate insulating film. When a silicon nitride film, (SiN film), for example, is to be formed, an $SiH_4$ gas or the like may be used as a first reactive gas (raw material gas), and $NH_3$, activated $N_2$ or the like may be used as a second reactive gas.

A one-by-one processing ALD method is being studied which uses a one-by-one processing film forming apparatus comprising a reaction container having a gas supply port at one end, and which supplies a reactive gas to a substrate from the side in one direction and discharges the reactive gas, which remains unreacted, and a reaction by-product from the reaction container in another direction.

Patent document 1 discloses a technique for forming a film by such an ALD method. The technique involves supplying a reaction species with a carrier gas to a substrate surface repeatedly in a pulsed manner.

A vertical CVD apparatus for forming a film by allowing a plurality of reactive gases, contributing to the formation of the film, to flow alternately is being studied as a batch-type ALD apparatus for carrying out the above-described film forming method. Patent document 2 discloses a vertical CVD apparatus for forming a film by such an ALD method. The CVD apparatus supplies two processing gases, contributing to the film formation, alternately into a vertical reaction chamber while discharging the gases, so that the gases are adsorbed onto a large number of substrates disposed in the reaction chamber and are reacted to form a film. The amounts of the reactive gases supplied are controlled by controlling the flow rate of each gas with a mass flow controller (MFC) provided in a gas supply pipe. The pressure in the reaction chamber is controlled by controlling the amount of exhaust gas through adjustment of the degree of opening of an exhaust valve provided in an exhaust pipe.

Generally in a CVD apparatus, a substrate is sometimes rotated in a reaction container in order to reduce the influence of asymmetry inherent in the apparatus on the substrate. For example, a substrate may be rotated in order to eliminate the influence of asymmetry of the position of an exhaust port relative to the substrate, the influence of a gas supply direction, etc. and to enhance the uniformity of the thickness of a film in the substrate. If the time for supply of a reactive gas is sufficiently long compared to the rotation period, the non-uniformity of the thickness of a film due to the influence of gas supply direction upon the formation of the film is not a significant problem.

In an ALD apparatus, however, a film forming process is carried out by repeating sequential processing cycles as described above. In an ALD process, a first reactant is introduced into a reaction chamber via a gas inlet or a manifold and forms a deposited layer on a substrate. An excess of the reactant gas is then exhausted from the reaction chamber in an exhaust step (see e.g. patent document 3). An inert purge gas is supplied from a gas inlet into the reaction chamber as necessary to discharge the remaining reactant. After the exhaust step, a second reactant is introduced into the reaction chamber. The second reactant introduced reacts with the deposited reactant to form an intended substrate layer. An excess of the reactant is then exhausted from the reaction chamber in an exhaust step. Layers may be added to the substrate surface by sequentially introducing and exhausting additional reactant gases into and from the reaction chamber. The time for supply of each reactive gas is tens of seconds at the longest and a dozen seconds at the shortest. A reactive gas is thus supplied for a shorter period of time in an ALD apparatus as compared to the conventional CVD apparatus.

The above-cited patent document 2, which describes the batch-type ALD apparatus, teaches in paragraph 0020 that $NH_3$ as a second feed gas is supplied for 5 to 120 seconds. The patent document 2 also teaches in paragraph 0021 that a DCS ($SiH_2Cl_2$: dichlorosilane) gas as a first feed gas is supplied instantaneously by using a gas pool in a gas supply pipe.

In the conventional CVD method, whether it be ordinary pressure CVD or reduced pressure CVD, a raw material is supplied to a reactor while, at the same time, an exhaust gas and an unreacted raw material are exhausted from the reactor so that the pressure in the reactor is kept constant during the formation of a film. Under such conditions, the flux of the raw material (amount of the raw material that passes through a predetermined area per unit time), flowing onto a substrate surface, is considered approximately constant irrespective of positions on the substrate surface. Consider now the adhesion probability of the raw material ("adhesion probability" herein refers to the value obtained by diving that portion of the flux which actually makes a film by the total flux in a certain area). $SiH_4$ and $SiH_2Cl_2$ (dichlorosilane), main Si film materials, have a low adhesion probability, whereas non-Si raw materials have a high adhesion probability. With increase in the adhesion probability, the raw material is more likely to be consumed (i.e. make a film) near a gas supply opening and a decreased amount of the raw material flux reaches an area of a substrate surface which is remote from the gas supply opening. A decrease in the raw material flux directly leads to a decrease in the thickness of a film. Thus, a high adhesion probability promotes the formation of a film on a substrate in an area near the gas supply opening and retards the film formation in an area remote from the gas supply opening.

Also in an ALD process, the adhesion probability affects the adsorption rate of a raw material vapor and the rate of a reaction between adsorbed raw materials and, when the time for supply of a reactive gas is short, can cause the problem of non-uniform film thickness in a substrate due to the influence of gas supply direction. In addition, the recent movement toward larger substrates makes the problem more serious because a gas supply nozzle must deal with a large substrate processing area.

Therefore, also in an ALD apparatus, a substrate is sometimes rotated in a reaction container in order to reduce the influence of asymmetry inherent in the apparatus on the substrate.

The time for supply of a gas is short in an ALD apparatus. Therefore, when a substrate is rotated, it is possible that the gas may be supplied to the substrate only in directions within a certain angular range as viewed from the substrate depending on the combination of the substrate rotation period and the timing of the supply of the gas, or even may be supplied only in the same direction when the substrate rotation period fully synchronizes with the timing of the supply of the gas, resulting in the formation of a non-uniform film on the substrate.

Some prior art documents address this problem. Patent document 4 discloses a technique of making a substrate rotation period non-synchronous with the timing of the supply of a gas while the gas is supplied a predetermined number of times.

Patent document 5 discloses an apparatus which, based on a mathematical expression, controls a substrate rotation period and the timing of the supply of a gas so that they are made non-synchronous while the gas is supplied a predetermined number of times.

Patent document 6 discloses an apparatus which, depending on the number of ALD processing cycles, makes the cycle period different from a substrate rotation period.

Patent document 7 discloses an apparatus which makes a peripheral position on a substrate, to which a gas is supplied in an ALD processing cycle, different from a peripheral position on the substrate to which a gas is supplied in the next processing cycle.

The techniques disclosed in the patent documents all control a substrate rotation period and the timing of the supply of a gas so that the gas is supplied to varying positions on a substrate during a predetermined number of ALD cycles. Such techniques, however, cannot exclude the possibility that the gas can be supplied to the substrate in the same direction under specific conditions.

PRIOR ART DOCUMENTS

Patent Documents

Patent document 1: Published Japanese Translation No. 2003-508932 of PCT International Application
Patent document 2: Japanese Patent Laid-Open Publication No. 2004-006801
Patent document 3: U.S. Pat. No. 5,916,365
Patent document 4: WO 2005/088692
Patent document 5: Japanese Patent Laid-Open Publication No. 2009-239304
Patent document 6: Japanese Patent Laid-Open Publication No. 2004-134466
Patent document 7: Japanese Patent Laid-Open Publication No. 2008-263224

The following relation generally holds for rotational ALD. In ALD, reactive gases A and B are alternately and repeatedly supplied to a substrate a number of times, as shown in FIG. 15, to form an intended film on the substrate. A purge step, a vacuuming step, etc. may be carried out every time after the gas A or the gas B is supplied. The period from the start of supply of the gas A to the start of the next supply of the gas A is called an ALD cycle. The ALD cycle is equal to the period from the start of supply of the gas B to the start of the next supply of the gas B.

Assuming the substrate is rotating at a rotational speed of N revolutions per minute, the substrate makes (1/60)N revolutions per second. Thus, the substrate makes "(1/60)N×T" revolutions during the ALC cycle time T (sec), i.e. during the period from the start of supply of the gas A to the start of the next supply of the gas A.

Accordingly, the substrate rotates through the following angle θ (radian) during the time T (sec) from the start of supply of the gas A to the start of the next supply of the gas A:

$$\theta = (1/60) \cdot N \times T \times 2\pi \text{(radian)}$$

Based on this relational expression, the following considerations will apply to the prior art documents. The patent document 4 teaches in paragraph 0014 that by finely controlling a rotation period P and a gas supply cycle T so as to satisfy the following relational expression, it becomes possible to prevent the timing of starting the supply of a gas A during the gas supply cycle from synchronizing with a particular position on a substrate, thereby enhancing the uniformity of a film:

$$|mP-nT| > \neq 0 (m \text{ and } n \text{ are natural numbers})$$

(">≠0" indicates that the left-hand value is truly larger than 0, and || represents absolute value)

The mathematical expression, however, only describes a simple mathematical fact, and does not make any sense technically. One skilled in the art could not in any way perform the suggested control based on the mathematical expression.

The same document also states in paragraph 0019 that "Assuming the wafer rotation period P=6.6666 sec and the gas supply cycle T=21 sec, the timing of blowing of DCS comes to synchronize with the first DCS blowing after a lapse of 1260 seconds, i.e. 60 cycles. Because DCS has been sufficiently distributed over a wafer surface thus far, the thickness of the film formed has a concentric uniform distribution as shown in FIG. 3C. The in-plane uniformity of the film is as good as 3.7% when the wafer rotation period thus does not synchronize with the gas supply cycle until after the elapse of a considerable number of cycles (see FIG. 3C)".

However, the wafer rotation period P=6.6666 sec corresponds to the rotational speed: N=1/(6.6666)×60=9 (rpm). Assuming the wafer rotates through angle θ1 during one ALD cycle, i.e. the gas supply cycle T=21 sec, the angle θ1 can be calculated from the above-described mathematical expression "θ=(1/60)·N×T×2π (radian)" as follows: θ1=(1/60)×9×21=3+3/20=3.15 (revolutions).

Thus, in fact, the wafer returns to the original position, that is, comes to synchronize after making 63 revolutions during 20 cycles. It is therefore unclear whether the patent document 4 teaches sufficient distribution of DCS after 60 cycles or after 20 cycles.

The patent document 5 is a divisional of the patent document 4 and contains the same disclosure. The Patent document 6 states in paragraph 0050 that "It is preferred to finely control the rotational speed of a substrate and the timing of the supply of a gas so that a gas supply port will not lie near the same position on the substrate every time the gas is supplied. For example, the rotational speed and the timing of the supply of the gas may be controlled in such a manner as to produce a difference of 45-degree rotation of the substrate in each cycle". However, the document fails to teach or suggest any mathematical expression to be used for performing the control of the rotational speed and the timing of the supply of the gas. Because of numerous possible combinations of parameters for the relevant control in a semiconductor device production site, it is unclear what combination enables the intended non-synchronous control. One skilled in the art could not in any way perform the suggested control.

The patent document 7 is a divisional of the patent document 6 and contains the same disclosure.

SUMMARY OF THE INVENTION

Problems to be Solved by the Invention

The present invention has been made in view of the above situation. It is therefore an object of the present invention to provide a film forming apparatus, a film forming method, a method for determining a rotational speed and a storage medium which, based on a relational expression derived from the rotational speed of an object to be processed relative to a direction in which a gas is supplied and from the timing of the supply of the gas, can eliminate the dependency on the gas supply direction upon the formation of a film on the object to be processed in response to various parameters during a certain number of cycles, thereby preventing the lowering of the in-plane uniformity of the thickness of the film formed.

Means for Solving the Problems

The present invention provides a film forming apparatus for forming an intended film on an object to be processed, comprising: a processing container for housing the object to be processed; a gas supply means having a gas jet port for jetting a gas toward the object to be processed; a holding means for holding the object to be processed in the processing container; a drive mechanism for rotating or periodically moving the holding means relative to the gas jet port; and a control means for controlling the gas supply means and the drive mechanism, wherein when repeating a cycle, consisting of a supply period for supplying at least one gas and a supply stop period during which the supply of the gas is stopped, P times (P is a natural number greater than 1) while controlling the gas supply means with the control means, the control means performs control so that a gas supply starting position is sequentially shifted in the circumferential direction of the object to be processed for every cycle in such a manner that the circumference of the object to be processed is divided into K segments (K=P), and the gas supply starting position is shifted by one segment for every cycle.

The present invention also provides a film forming apparatus for forming an intended film on an object to be processed, comprising: a processing container for housing the object to be processed; a gas supply means having a gas jet port for jetting a gas toward the object to be processed; a holding means for holding the object to be processed in the processing container; a drive mechanism for rotating or periodically moving the holding means relative to the gas jet port; and a control means for controlling the gas supply means and the drive mechanism, wherein when repeating a cycle, consisting of a supply period for supplying at least one gas and a supply stop period during which the supply of the gas is stopped, P times (P is a natural number greater than 1) while controlling the gas supply means with the control means, the control means performs control so that a gas supply starting position is sequentially shifted in the circumferential direction of the object to be processed for every cycle in such a manner that the circumference of the object to be processed is divided into K segments (K≤P), K being a set division number, and the gas supply starting position is shifted by 1/K of the circumference for every cycle.

The present invention also provides a film forming apparatus for forming an intended film on an object to be processed, comprising: a processing container for housing the object to be processed; a gas supply means having a gas jet port for jetting a gas toward the object to be processed; a holding means for holding the object to be processed in the processing container; a drive mechanism for rotating or periodically moving the holding means relative to the gas jet port; and a control means for controlling the gas supply means and the drive mechanism, wherein when repeating a cycle, consisting of a supply period for supplying at least one gas and a supply stop period during which the supply of the gas is stopped, P times (P is a natural number greater than 1) while controlling the gas supply means with the control means, the control means controls the rotational speed N (rpm) of the holding means relative to the gas jet port or the period T of the cycle so that they satisfy the following relational expressions and that a gas supply starting position is sequentially shifted in the circumferential direction of the object to be processed for every cycle in such a manner that the circumference of the object to be processed is divided into K segments (K is a natural number), K being a set division number, and the gas supply starting position is shifted by 1/K of the circumference for every cycle:

$$n \pm 1/K = T \cdot N/60 \text{ (}n \text{ is a natural number)}$$

$$P \geq K$$

The present invention also provides a film forming apparatus for forming an intended film on an object to be processed, comprising: a processing container for housing the object to be processed; a gas supply means having a gas jet port for jetting a gas toward the object to be processed; a holding means for holding the object to be processed in the processing container; a drive mechanism for rotating or periodically moving the holding means relative to the gas jet port; and a control means for controlling the gas supply means and the drive mechanism, wherein when repeating a cycle, consisting of a supply period for supplying at least one gas and a supply stop period during which the supply of the gas is stopped, P times (P is a natural number greater than 1) while controlling the gas supply means with the control means, the control means performs control so that a gas supply starting position is sequentially shifted in the circumferential direction of the object to be processed for every cycle in such a manner that the circumference of the object to be processed is divided into K segments (K is a natural number), K being a set division number, and the gas supply starting position is shifted by 1/K of the circumference for every cycle, and that when the Kth rotational angle is equal to an integral multiple of $2\pi$, the average of the shift angle ($1/60 \cdot Tx \cdot Nx \cdot 2\pi$) in each cycle is equal to $2\pi/K$, where Tx represents a gas supply cycle, i.e. the time from the start of supply of a gas to the start of the next supply of the gas, and Nx represents the relative rotational speed (rpm) of the object to be processed.

The present invention also provides a film forming apparatus for forming an intended film on an object to be processed, comprising: a processing container for housing the object to be processed; a gas supply means having a gas jet port for jetting a gas toward the object to be processed; a holding means for holding the object to be processed in the processing container; a drive mechanism for rotating or periodically moving the holding means relative to the gas jet port; and a control means for controlling the gas supply means and the drive mechanism, wherein when repeating a cycle, consisting of a supply period for supplying at least one gas and a supply stop period during which the supply of the gas is stopped, P times (P is a natural number greater than 1) while controlling the gas supply means with the control means, the control means performs control so that a gas supply starting position is sequentially shifted in the circumferential direction of the object to be processed for every cycle in such a manner that the circumference of the object to be processed is divided into K segments (K is a natural number greater than 1), K being a set division number, and the gas supply starting position is shifted by 1/K of the circumference for a cycle just before or after an arbitrary cycle of the P cycles.

The present invention also provides a film forming apparatus for forming an intended film on an object to be processed, comprising: a processing container for housing the object to be processed; a gas supply means having a gas jet port for jetting a gas toward the object to be processed; a holding means for holding the object to be processed in the processing container; a drive mechanism for rotating or periodically moving the holding means relative to the gas jet port; and a control means for controlling the gas supply means and the drive mechanism, wherein when repeating a cycle, consisting of a supply period for supplying at least one gas and a supply stop period during which the supply of the gas is stopped, P times (P is a natural number greater than 1) while controlling the gas supply means with the control means, the control means performs control so that a gas supply starting position is sequentially shifted in the circumferential direction of the object to be processed for every cycle in such a manner that the circumference of the object to be processed is divided into K segments each having an equally-divided central angle, K being a set division number, and the gas supply starting position is shifted by one segment for every cycle, and that when the resolution of a motor of the drive mechanism is defined as a pulse number Q required for one revolution of the motor shaft, the step angle of the motor=360°/Q and the equally-divided central angle is equal to an integral multiple of the step angle.

The present invention also provides a film forming apparatus for forming an intended film on an object to be processed, comprising: a processing container for housing the object to be processed; a gas supply means having a gas jet port for jetting a gas toward the object to be processed; a holding means for holding the object to be processed in the processing container; a drive mechanism for rotating or periodically moving the holding means relative to the gas jet port; and a control means for controlling the gas supply means and the drive mechanism, wherein when repeating a cycle, consisting of a supply period for supplying at least one gas and a supply stop period during which the supply of the gas is stopped, P times (P is a natural number greater than 1) while controlling the gas supply means with the control means, the control means performs control so that a gas supply starting position is sequentially shifted in the circumferential direction of the object to be processed for every cycle in such a manner that the circumference of the object to be processed is divided into at least two angular zones, a first angular zone having a first angle $\alpha 1$ and a second angular zone having a second angle $\alpha 2$, and the gas supply starting position is shifted by the first angle $\alpha 1$ in the first angular zone and by the second angle $\alpha 2$ in the second angular zone for every cycle.

The present invention also provides a film forming apparatus for forming an intended film on an object to be processed, comprising: a processing container for housing the object to be processed; a gas supply means having a gas jet port for jetting a gas toward the object to be processed; a holding means for holding the object to be processed in the processing container; a drive mechanism for rotating or periodically moving the holding means relative to the gas jet port; and a control means for controlling the gas supply means and the drive mechanism, wherein when repeating a cycle, consisting of a supply period for supplying at least one gas and a supply stop period during which the supply of the gas is stopped, P times (P is a natural number greater than 1) while controlling the gas supply means with the control means, the control means performs control so that a gas supply starting position is sequentially shifted in the circumferential direction of the object to be processed for every cycle in such a manner that the circumference of the object to be processed is divided into at least two angular zones, a first angular zone having a division number Ka and a first angle $\alpha 1$ and a second angular zone having a division number Kb and a second angle $\alpha 2$, and the gas supply starting position is shifted by the first angle $\alpha 1$ in the first angular zone and by the second angle $\alpha 2$ in the second angular zone for every cycle, and that when the density of the division number Ka per unit angle in the first angular zone is taken as 1, the density of the division number Kb per unit angle in the second angular zone is made d by determining the division numbers Ka, Kb that satisfy the following expressions (A) and (B):

$$Ka+Kb=K \qquad (A)$$

$$Ka/\delta=1/d\times(Kb/\gamma) \qquad (B)$$

where K (natural number greater than 1) is the total division number, $\delta$ represents the central angle of the first angular zone and $\gamma$ represents the central angle of the second angular zone, and then determining a combination of a gas supply cycle T, i.e. the time from the start of supply of a gas A to the start of the next supply of the gas A, and the relative rotational speed N (rpm) of the object to be processed, the combination satisfying the following expressions, during the P cycles for each of the first and second angular zones by changing T·N or at least one of T and N:

$$n\pm 1/Ka=T\cdot N/60(n \text{ is a natural number})$$

$$n\pm 1/Kb=T\cdot N/60(n \text{ is a natural number}).$$

The present invention also provides a film forming method for forming an intended film on an object to be processed by using a film forming apparatus comprising: a processing container for housing the object to be processed; a gas supply means having a gas jet port for jetting a gas toward the object to be processed; a holding means for holding the object to be processed in the processing container; a drive mechanism for rotating or periodically moving the holding means relative to the gas jet port; and a control means for controlling the operation of the entire apparatus, said method comprising repeating a cycle, consisting of a supply period for supplying at least one gas and a supply stop period during which the supply of the gas is stopped, P times (P is a natural number greater than 1) while controlling the gas supply means with the control means, wherein the control means performs control so that a gas supply starting position is sequentially shifted in the circumferential direction of the object to be processed for every cycle in such a manner that the circumference of the object to be processed is divided into K segments (K=P), and the gas supply starting position is shifted by one segment for every cycle.

The present invention also provides a film forming method for forming an intended film on an object to be processed by using a film forming apparatus comprising: a processing container for housing the object to be processed; a gas supply means having a gas jet port for jetting a gas toward the object to be processed; a holding means for holding the object to be processed in the processing container; a drive mechanism for rotating or periodically moving the holding means relative to the gas jet port; and a control means for controlling the operation of the entire apparatus, said method comprising repeating a cycle, consisting of a supply period for supplying at least one gas and a supply stop period during which the supply of the gas is stopped, P times (P is a natural number greater than 1) while controlling the gas supply means with the control means, wherein the control means performs control so that a gas supply starting position is sequentially shifted in the circumferential direction of the object to be processed for every cycle in such a manner that the circumference of the object to be processed is divided into K segments (K is a natural number greater than 1), K being a set division number, and the gas supply starting position is shifted by 1/K of the circumference for every cycle.

The present invention also provides a film forming method for forming an intended film on an object to be processed by using a film forming apparatus comprising: a processing container for housing the object to be processed; a gas supply means having a gas jet port for jetting a gas toward the object to be processed; a holding means for holding the object to be processed in the processing container; a drive mechanism for rotating or periodically moving the holding means relative to the gas jet port; and a control means for controlling the operation of the entire apparatus, said method comprising repeating a cycle, consisting of a supply period for supplying at least one gas and a supply stop period during which the supply of the gas is stopped, P times (P is a natural number greater than 1) while controlling the gas supply means with the control means, wherein the control means performs control so that a gas supply starting position is sequentially shifted in the circumferential direction of the object to be processed for every cycle in such a manner that the circumference of the object to be processed is divided into K segments (K≤P), K being a set division number, and the gas supply starting position is shifted by 1/K of the circumference for every cycle.

The present invention also provides a film forming method for forming an intended film on an object to be processed by using a film forming apparatus comprising: a processing container for housing the object to be processed; a gas supply means having a gas jet port for jetting a gas toward the object to be processed; a holding means for holding the object to be processed in the processing container; a drive mechanism for rotating or periodically moving the holding means relative to the gas jet port; and a control means for controlling the operation of the entire apparatus, said method comprising repeating a cycle, consisting of a supply period for supplying at least one gas and a supply stop period during which the supply of the gas is stopped, P times (P is a natural number greater than 1) while controlling the gas supply means with the control means, wherein the control means controls the rotational speed N (rpm) of the holding means relative to the gas jet port and the period T of the cycle so that they satisfy the following relational expressions and that a gas supply starting position is sequentially shifted in the circumferential direction of the object to be processed for every cycle in such a manner that the circumference of the object to be processed is divided into K segments (K is a natural number), K being a set division number, and the gas supply starting position is shifted by 1/K of the circumference for every cycle:

$$n \pm 1/K = T \cdot N/60 \, (n \text{ is a natural number})$$

$$P \geq K$$

The present invention also provides a film forming method for forming an intended film on an object to be processed by using a film forming apparatus comprising: a processing container for housing the object to be processed; a gas supply means having a gas jet port for jetting a gas toward the object to be processed; a holding means for holding the object to be processed in the processing container; a drive mechanism for rotating or periodically moving the holding means relative to the gas jet port; and a control means for controlling the operation of the entire apparatus, said method comprising repeating a cycle, consisting of a supply period for supplying at least one gas and a supply stop period during which the supply of the gas is stopped, P times (P is a natural number greater than 1) while controlling the gas supply means with the control means, wherein the control means performs control so that a gas supply starting position is sequentially shifted in the circumferential direction of the object to be processed for every cycle in such a manner that the circumference of the object to be processed is divided into K segments (K is a natural number greater than 1), K being a set division number, and the gas supply starting position is shifted by 1/K of the circumference for a cycle just before or after an arbitrary cycle of the P cycles.

The present invention also provides a film forming method for forming an intended film on an object to be processed by using a film forming apparatus comprising: a processing container for housing the object to be processed; a gas supply means having a gas jet port for jetting a gas toward the object to be processed; a holding means for holding the object to be processed in the processing container; a drive mechanism for rotating or periodically moving the holding means relative to the gas jet port; and a control means for controlling the operation of the entire apparatus, said method comprising repeating a cycle, consisting of a supply period for supplying at least one gas and a supply stop period during which the supply of the gas is stopped, P times (P is a natural number greater than 1) while controlling the gas supply means with the control means, wherein the control means performs control so that a gas supply starting position is sequentially shifted in the circumferential direction of the object to be processed for every cycle in such a manner that the circumference of the object to be processed is divided into at least two angular zones, a first angular zone having a first angle $\alpha 1$ and a second angular zone having a second angle $\alpha 2$, and the gas supply starting position is shifted by the first angle $\alpha 1$ in the first angular zone and by the second angle $\alpha 2$ in the second angular zone for every cycle.

The present invention also provides a method for optimizing a rotational speed in a film forming apparatus for forming an intended film on an object to be processed by repeating a cycle of supplying at least one gas a number of times, comprising: a processing container for housing the object to be processed; a gas supply means having a gas jet port for jetting a gas toward the object to be processed; a holding means for holding the object to be processed in the processing container; a drive mechanism for rotating or periodically moving the holding means relative to the gas jet port; and a control means for controlling the operation of the entire apparatus, said method comprising determining a new rotational speed N (rpm) of the object to be processed relative to a gas supply starting position by the following steps so that as viewed from the center of the object to be processed, the gas supply starting position is sequentially shifted between equally-spaced X positions one by one and by an equal central angle for each cycle: the step of determining a natural number M which satisfy the following expression (1):

$$1/60 \cdot (T1 \times N1) = M \pm 1/X \tag{1},$$

where T1 represents a fixed gas supply cycle, i.e. the time from the start of supply of a gas A to the start of the next supply of the gas A, and N1 represents the initial rotational speed (rpm) of the object to be processed; and the step of substituting the determined number M into the following expression (2) to determine the new relative rotational speed N (rpm):

$$1/60 \cdot (T1 \times N) = M \pm 1/X \quad (2).$$

The present invention also provides a method for optimizing a gas supply cycle in a film forming apparatus for forming an intended film on an object to be processed by repeating a cycle of supplying at least one gas a number of times (p), comprising: a processing container for housing the object to be processed; a gas supply means having a gas jet port for jetting a gas toward the object to be processed; a holding means for holding the object to be processed in the processing container; a drive mechanism for rotating or periodically moving the holding means relative to the gas jet port; and a control means for controlling the operation of the entire apparatus, said method comprising determining a new gas supply cycle by the following steps so that as viewed from the center of the object to be processed, the gas supply starting position is sequentially shifted between equally-spaced X positions one by one and by an equal central angle for each cycle: the step of determining a natural number M which satisfy the following expression (1):

$$1/60 \cdot (T1 \times N1) = M \pm 1/X$$

(1), where T1 represents a gas supply cycle, i.e. the time from the start of supply of a gas A to the start of the next supply of the gas A, and N1 represents the fixed rotational speed (rpm) of the object to be processed; and the step of substituting the determined number M into the following expression (2) to determine the new gas supply cycle T:

$$1/60 \cdot (T \times N1) = M \pm 1/X \quad (2).$$

Advantageous Effects of the Invention

The film forming apparatus, the film forming method, the method for optimizing a rotational speed and the storage medium of the present invention can achieve the following advantageous effects:

In a process for forming a film on an object to be processed by sequentially supplying a gas (gases) to the surface of the object to be processed and thereby laminating layers of a reaction product, the rotational speed of the object to be processed and a gas supply cycle are controlled so that as viewed from the object to be processed, the gas is supplied from a number of arbitrarily set points curing a predetermined number of cycles. This makes it possible to eliminate the dependency on gas supply direction in the formation of the film on the object to be processed, thereby preventing the lowering of the in-plane uniformity of the thickness of the film formed.

DETAILED DESCRIPTION OF THE INVENTION

Preferred embodiments of a film forming apparatus, a film forming method, a method for optimizing a rotational speed and a storage medium, according to the present invention, will now be described in detail with reference to the drawings.

Figure 1:
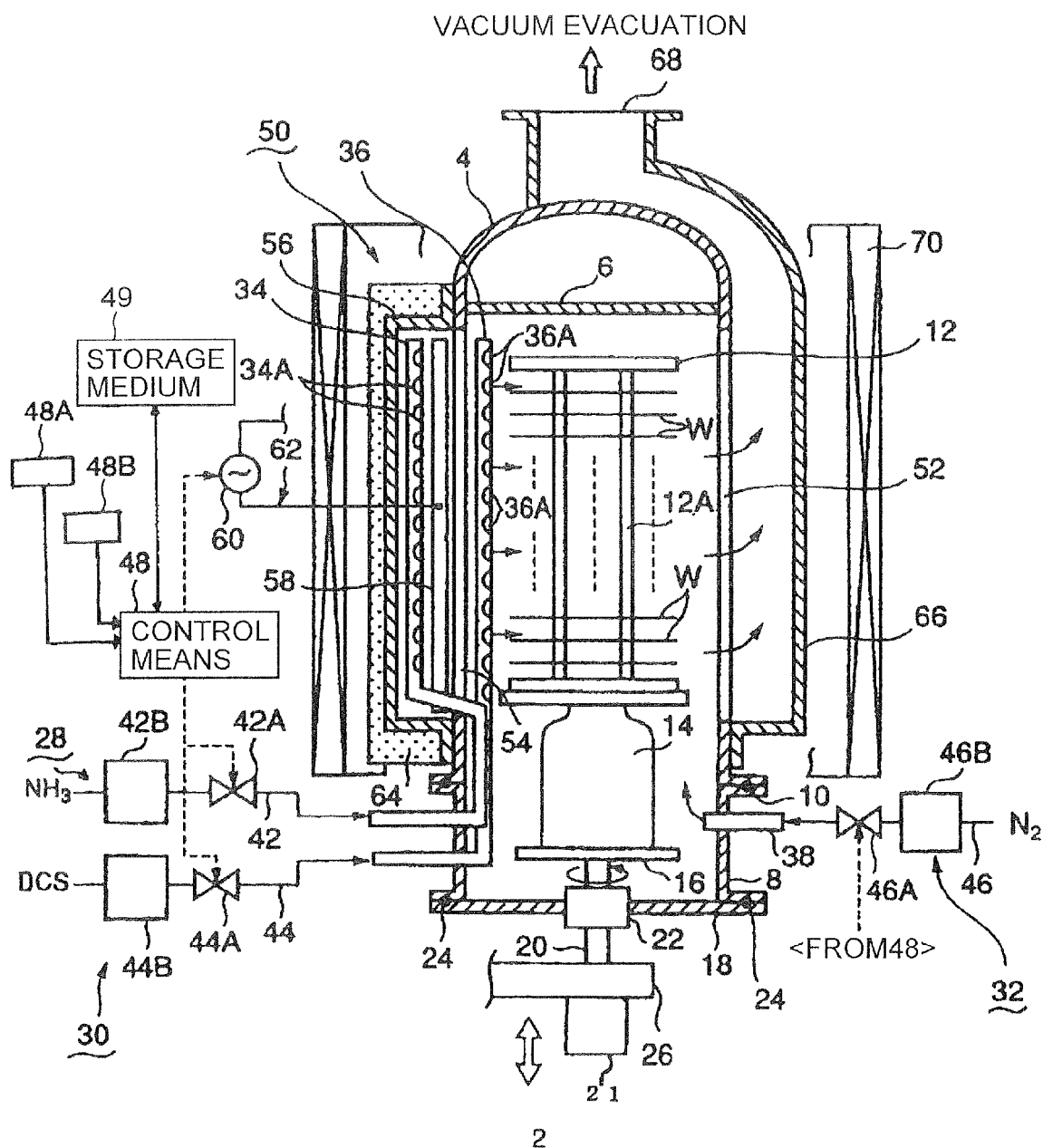
FIG. 1 is a vertical sectional view showing an exemplary film forming apparatus according to the present invention.
Figure 2:
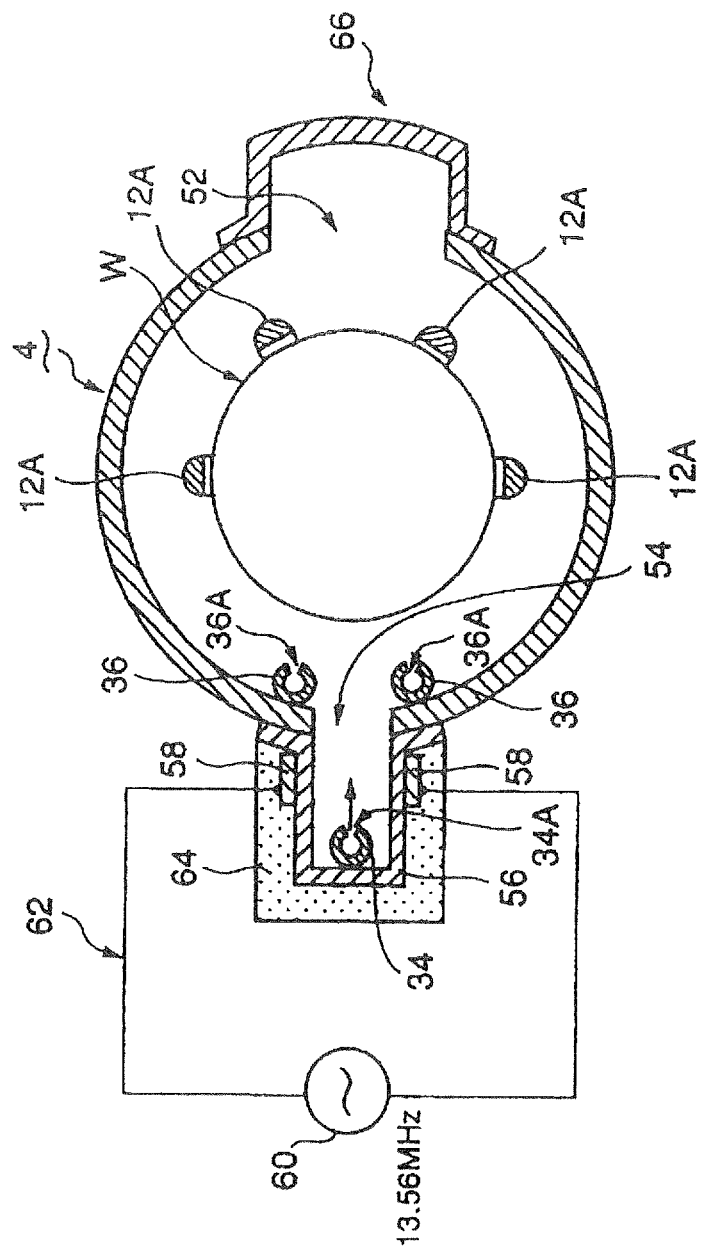
FIG. 2 is a cross-sectional view showing the film forming apparatus (heating means omitted)
Figure 3:
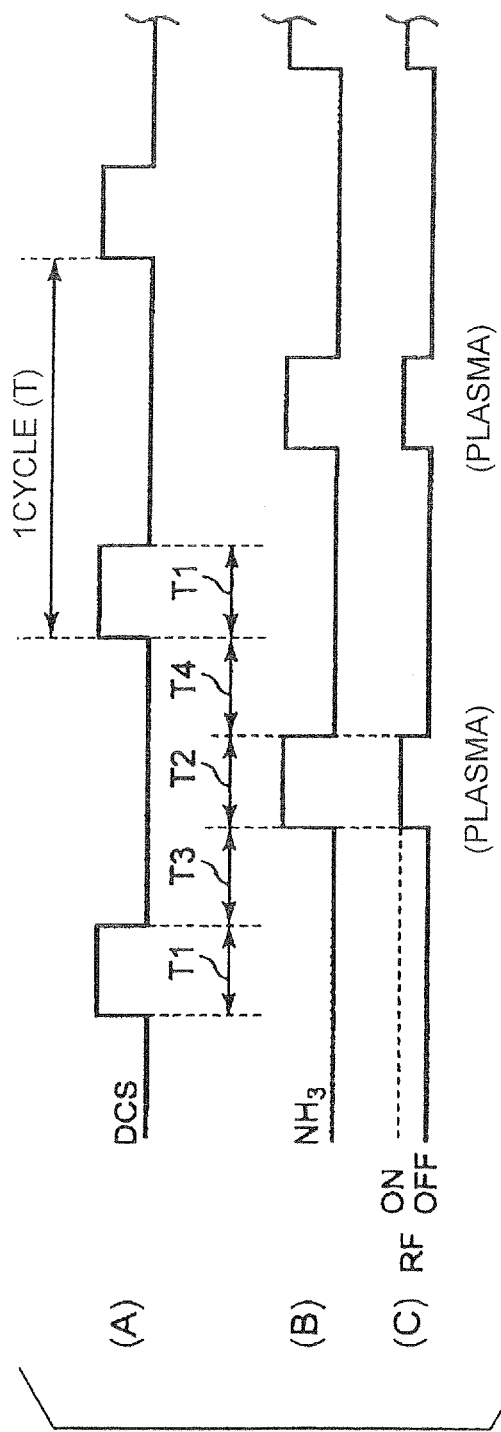
FIG. 3 is a timing chart showing the timing of supply of gases under conditions 1 in the film forming apparatus.

FIG. 1 is a vertical sectional view showing an exemplary film forming apparatus according to the present invention; FIG. 2 is a cross-sectional view showing the film forming apparatus (heating means omitted); and FIG. 3 is a timing chart showing the timing of supply of gases under conditions 1 in the film forming apparatus. The following description illustrates an exemplary case in which dichlorosilane (DCS), a silane gas, is used as a raw material gas which is an example of a first gas A, and ammonia gas ($NH_3$), a nitriding gas, is used as an aid gas which is an example of a second gas B, and in which the $NH_3$ gas is plasma-activated to form a silicon nitride (SiN) film.

The illustrated film forming apparatus 2, which is capable of forming a plasma, includes a cylindrical processing container 4 having a closed top and an open bottom. The processing container 4 is formed of e.g. quartz, and is provided with a quartz ceiling plate 6 which seals the processing container 4. A cylindrical manifold 8, e.g. formed of stainless steel, is coupled to the bottom opening of the processing container 4 via a sealing member 10 such as an O-ring.

The lower end of the processing container 4 is supported by the manifold 8. A quartz wafer boat 12 as a holding means for holding a plurality of substrates, in particular semiconductor wafers W, as objects to be processed in multiple stages, can be moved vertically and inserted into the processing container 4 from below the manifold 8. In this embodiment the wafer boat 12 includes a plurality of, e.g. four, support posts 12A which can support e.g. 50 to 100 wafers W, e.g. having a diameter of 300 mm, in multiple stages at an approximately equal pitch. The wafer boat 12 is generally configured to be capable of inserting and removing wafers W in a horizontal position into and from it in one direction. Thus, the four support posts 12A are arranged along a semicircular arc portion of the circular contour of a wafer W, and the wafer W is transferred from the other semicircular arc side where the support posts 12A are not provided.

The wafer boat 12 is mounted on a table 16 via a quartz heat-retaining cylinder 14. The table 16 is supported on a rotating shaft 20 which penetrates through a lid 18, e.g. made of stainless steel, for opening and closing the bottom opening of the manifold 8.

The rotating shaft 20, in its portion penetrating through the manifold 8, is provided with e.g. a magnetic fluid seal 22 which rotatably supports the rotating shaft 20 while hermetically sealing the rotating shaft 20. A sealing member 24 such as an O-ring is interposed between the peripheral portion of the lid 18 and the lower end of the manifold 8 for sealing of the processing container 4.

The rotating shaft 20 is mounted to the front end of an arm 26 which is supported by a lifting mechanism (not shown), such as a boat elevator, so that the wafer boat 12, together with the lid 18, etc., can be moved vertically and inserted into and withdrawn from the processing container 4. The lower end of the rotating shaft 20 is coupled to a drive mechanism 21, provided at the front end of the arm 26, so that the wafer boat 12 can be rotated. A pulse motor such as a stepping motor, which is capable of accurate positioning and indexing, can be used as the drive mechanism 21.

The manifold 8 is provided with an aid gas supply means 28 for supplying to the processing container 4 an aid gas, e.g. ammonia ($NH_3$) gas, which is to be turned into a plasma, a raw material gas supply means 30 for supplying a raw material gas, e.g. a silane gas such as DCS (dichlorosilane), and a purge gas supply means 32 for supplying a purge gas, e.g. an inert gas such as $N_2$ gas. The airaid gas supply means 28 has an aid gas dispersing nozzle 34, made of quartz, which penetrates through the side wall of the manifold 8 into the processing container 4, and is bent and extends upwardly in the processing container 4. The aid gas dispersing nozzle 34 has a large number of gas jet ports 34A arranged at predetermined intervals along the longitudinal direction of the nozzle 34, so that ammonia gas can be jetted horizontally and approximately uniformly from the gas jet nozzles 34A.

Similarly, the raw material gas supply means 30 has two raw material gas dispersing nozzles 36 (see FIG. 2), made of quartz, which penetrate through the side wall of the manifold 8 into the processing container 4, and are bent and extend upwardly in the processing container 4. The raw material gas dispersing nozzles 36 each have a large number of gas jet ports 36A arranged at predetermined intervals along the longitudinal direction of the nozzle 36, so that DCS gas can be jetted horizontally and approximately uniformly from the gas jet nozzles 36A. It is also possible to provide only one, not two, raw material gas dispersing nozzle 36. Similarly, the purge gas supply means 32 has a gas nozzle 38 which penetrates through the side wall of the manifold 8 into the processing container 4. The nozzles 34, 36, 38 are connected to gas passages 42, 44, 46, respectively.

The gas passages 42, 44, 46 are provided with on-off valves 42A, 44A, 46A and flow controllers 42B, 44B, 46B such as mass flow controllers, respectively, so that $NH_3$ gas, DCS gas and $N_2$ gas can be supplied while controlling the flow rate of each gas. The supply of each gas, the stop of the supply of each gas, control of the flow rate of each gas, control of the rotational speed of the wafer boat 12, on/off control of high-frequency waves, etc. are performed by a control means 48 e.g. comprised of a microcomputer. The control means 48 also controls the overall operation of the film forming apparatus 2. The control means 48 has a storage medium 49 which stores a program for executing control of the supply of each gas, the stop of the supply of each gas, the flow rate of each gas, the rotational speed of the wafer boat 12, on/off of high-frequency waves and the operation of the entire film forming apparatus 2. A flexible disc, a CD (compact disc), a hard disc, a flash memory, a DVD, or the like may be used as the storage medium 49.

The control means 48 performs control so as to carry out film forming processing according to the below-described embodiments. In particular, when repeating a cycle, consisting of a supply period for supplying at least one gas and a supply stop period during which the supply of the gas is stopped, a number of times, the control means 48 performs control so that as viewed from the center of a wafer W, a gas supply starting position is sequentially shifted in the circumferential direction of the wafer W for every cycle. To the control means 48 is connected a processing condition input means 48A capable of inputting processing conditions (film forming recipe, or simply referred to as recipe) for the film forming apparatus 2. The processing conditions include operating conditions for the apparatus, the cycle repetition number and/or the below-described division number in the division of the entire circumference of a wafer. The cycle repetition number and the division number are represented by "P" and "K", respectively, as described later. The control means 48 itself has a communication function to receive the processing conditions from an external host computer 48B.

An activation means 50 for generating a plasma of the aid gas along the height direction of the activation means 50 and thereby activating the aid gas is provided in a part of the side wall of the processing container 4. In the side wall of the processing container 4 at a position opposite the activation means 50 is provided a vertically elongated exhaust opening 52 for evacuating the internal atmosphere from the processing container 4. The exhaust opening 52 has been formed e.g. by cutting off a part of the side wall of the processing container 4. The activation means 50 has been formed by cutting off a part of the side wall of the processing container 4 to form a vertically elongated opening 54 having a predetermined width, and hermetically welding and bonding a vertically elongated plasma compartment wall 56, having a recessed cross-sectional shape and made of e.g. quartz, to the wall of the processing container 4 such that the plasma compartment wall 56 covers the outer side of the opening 54. Thus, by outwardly hollowing a part of the side wall of the processing container 4, the activation means 50 which opens to and communicates with the interior of the processing container 4 is formed integrally with the processing container 4. The internal space of the plasma compartment wall 56 communicates with the interior of the processing container 4. Thus, the plasma compartment wall 56 constitutes a part of the processing container 4, and the internal space of the plasma compartment wall 56 is part of the internal space of the processing container 4. The opening 54 is sufficiently long vertically so that it can cover all the wafers W, held in the wafer boat 12, in the height direction.

A pair of elongated plasma electrodes 58 is provided on the outer surfaces of the opposing side walls of the plasma compartment wall 56 such that the electrodes 58 oppose each other along the longitudinal direction (vertical direction). A high-frequency power source 60 for plasma generation is connected to the plasma electrodes 58 via a feed line 62 so that a plasma can be generated by applying a high-frequency voltage of e.g. 13.56 MHz to the plasma electrodes 58. The high-frequency voltage may have any other frequency, e.g. 400 kHz.

The aid gas dispersing nozzle 34, extending upward in the processing container 4, is bent outward in the radial direction of the processing container 4 and reaches the remotest surface (farthest from the center of the processing container 4) of the plasma compartment wall 56, and then extends upward along the remotest surface. Therefore, when the high-frequency power source 60 is on, ammonia gas jetted from the gas jet ports 34A of the air gas dispersing nozzle 34 is activated in the activation means 50 and flows toward the center of the processing container 4 while diffusing.

An insulating protective cover 64, e.g. made of quartz, is attached to and covers the outer side of the plasma compartment wall 56. The insulating protective cover 64, in an inner portion, is provided with a not-shown coolant passage so that the plasma electrodes 58 can be cooled by passing cooled nitrogen gas through the coolant passage.

The two raw material gas dispersing nozzles 36 in an upright position are provided outside and close to the opening of the plasma compartment wall 56, i.e. on both sides of the opening 54 (in the processing container 4). A silane gas can be jetted from the gas jet ports 36A, provided in each nozzle 36, toward the center of the processing container 4.

On the other hand, the exhaust opening 52, provided opposite the opening 54, is provided with an exhaust opening cover member 66 made of quartz and having a U-shaped cross-section. The cover member 66 is attached by welding to the side wall of the processing container 4 such that it covers the exhaust opening 52. The exhaust opening cover member 66 extends vertically along the side wall of the processing container 4, and can be evacuated by means of a not-shown evacuation system having a vacuum pump, etc., and connected to a gas outlet 68 provided above the processing container 4. A cylindrical heating means 70 for heating the processing container 4 and the wafers W held therein is provided such that it surrounds the circumference of the processing container 4.

The timing of the supply of the gases in film forming processing, carried out under conditions 1 by using the thus-constructed film forming apparatus, will now be described with reference also to FIG. 3. The following description illustrates an exemplary case in which a silicon nitride film is intermittently formed on a wafer surface at a low temperature with the use of a plasma. In particular, DCS gas as a raw material gas and $NH_3$ gas as an aid gas are supplied alternately and intermittently, i.e. in a pulsed manner. The $NH_3$ gas is turned into a plasma and thus activated. Referring to FIG. 3, the starting position of a supply pulse of a gas indicates the gas supply starting position. This holds true for the below-described other figures illustrating the supply of a gas.

First, the wafer boat 12, holding a large number of, for example 50 to 100, 300-mm wafers W at room temperature is raised and loaded into the processing container 4 which has been kept at a predetermined temperature, and then the processing container 4 is hermetically closed by closing the bottom opening of the manifold 8 with the lid 18.

While evacuating the processing container 4 to maintain a predetermined processing pressure, the temperature of the wafers W is raised to a processing temperature by increasing the power supplied to the heating means 70. The processing gases are supplied alternately and intermittently from the raw material supply means 30 and the aid gas supply means 28 to the wafers W held in the rotating wafer boat 12, thereby forming a silicon nitride film on the surface of each wafer W. When supplying the aid gas, the high-frequency power source (RF power source) 60 is turned on to generate a plasma.

More specifically, $NH_3$ gas is jetted horizontally from each of the gas jet ports 34A of the aid gas dispersing nozzle 34, and DCS gas is jetted horizontally from each of the gas jet ports 36A of the raw material gas dispersing nozzles 36, and the two gases react with each other to form a silicon nitride film. The two gases are not supplied continuously but supplied alternately, intermittently and repeatedly at different timings with intervening periods (purge periods) T3, T4, each for evacuating a residual gas from the processing container 4 by vacuuming, interposed between gas supply periods for the gases, as shown in FIG. 3, thereby repeating the formation of a layer of silicon nitride film. When $NH_3$ gas is supplied as shown in FIG. 3(B), the RF power source is turned on as shown in FIG. 3(C) to generate a plasma. The $NH_3$ gas supplied is thus activated, that is, activated species is produced, which promotes the reaction (decomposition). In the intervening periods T3, T4, $N_2$ gas which is an inert gas may be supplied into the processing container 4 to discharge a residual gas. Alternatively, a residual gas may be discharged from the processing container 4 by continuing vacuuming while stopping the supply of all the gases. In FIG. 3, T1 represents the period for supplying DCS gas, T2 represents the period for supplying $NH_3$ gas, T3 represents the intervening period from the stop of the supply of DCS gas to the start of the supply of $NH_3$ gas, and T4 represents the intervening period from the stop of the supply of $NH_3$ gas to the start of the supply of DCS gas.

With reference to conditions for the film forming processing, the flow rate of DCS gas may be in the range of 100 to 3000 sccm, e.g. 1000 sccm (1 slm). The flow rate of $NH_3$ gas may be in the range of 100 to 3000 sccm, e.g. 1000 sccm. The processing temperature is lower than that of CVD film forming processing and may be in the rage of room temperature to about 600° C., e.g. 550° C.

The processing pressure may be in the range of 27 Pa (0.2 Torr) to 1330 Pa (10 Torr). In particular, the processing pressure is, for example, 1 Torr in the adsorption step and 0.3 Torr in the nitridation step using a plasma. If the processing pressure is lower than 27 Pa, the film forming rate will be less than a practical level. If the processing pressure is higher than 1300 Pa, on the other hand, a plasma will not be generated sufficiently.

The film forming method of the present invention will now be described with reference also to FIGS. 4 through 7. As described above, a first embodiment of the method of the present invention is characterized in that when repeating a cycle, consisting of a supply period for supplying at least one gas and a supply stop period during which the supply of the gas is stopped, a number of times, control is performed so that as viewed from the center of a wafer W, a gas supply starting position is sequentially shifted in the circumferential direction of the wafer W for every cycle. More specifically, in the first embodiment, when repeating P times (P is a natural number greater than 1) a cycle, consisting of a supply period for supplying at least one gas and a supply stop period during which the supply of the gas is stopped, control is performed so that as viewed from the center of a wafer W, a gas supply starting position is sequentially shifted in the circumferential direction of the wafer W for every cycle in such a manner that the entire circumference of the wafer W is divided into K segments (K=P), and the gas supply starting position is shifted by one segment for every cycle. Thus, in the first embodiment, the cycle repetition number P and the division number K in the division of the entire circumference of a wafer are set to be equal. There is a case of P≠K in other embodiments.

Figure 4:
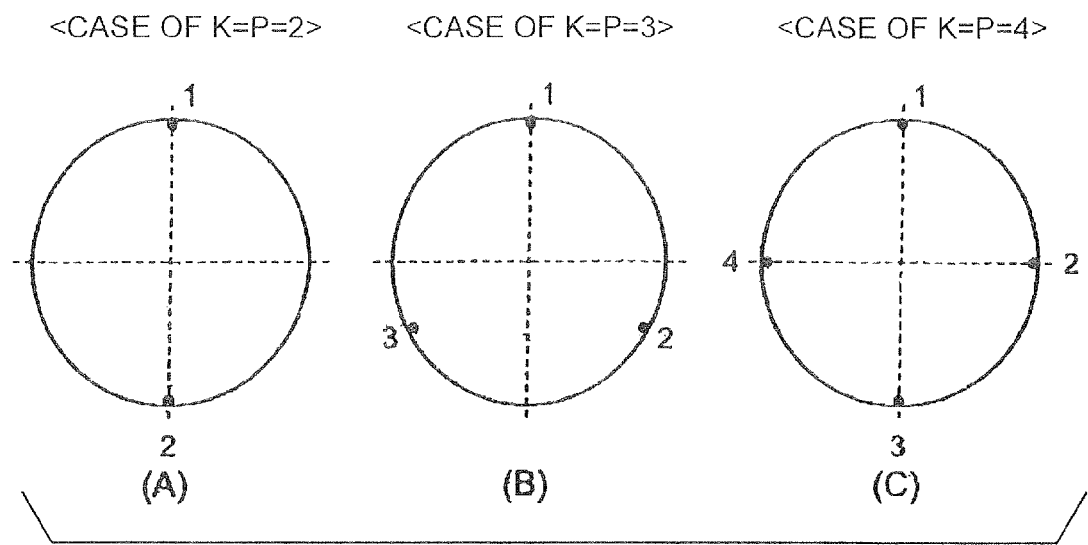
FIG. 4 is a diagram illustrating a relationship between an arbitrarily set repetition number P for ALD cycles and optimum gas supply starting positions.
Figure 5:
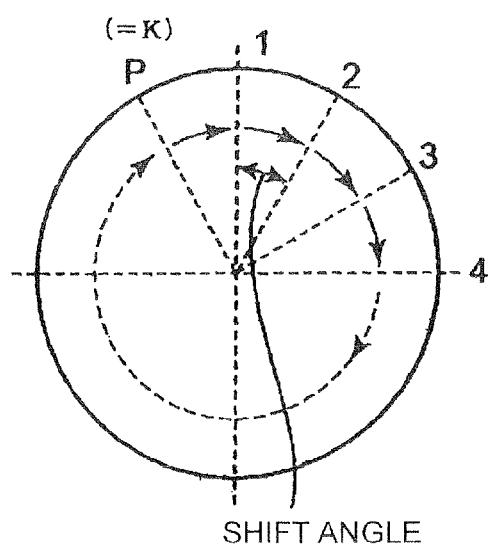
FIG. 5 is a diagram illustrating the shifting of a gas supply starting position as viewed from a substrate.
Figure 6:
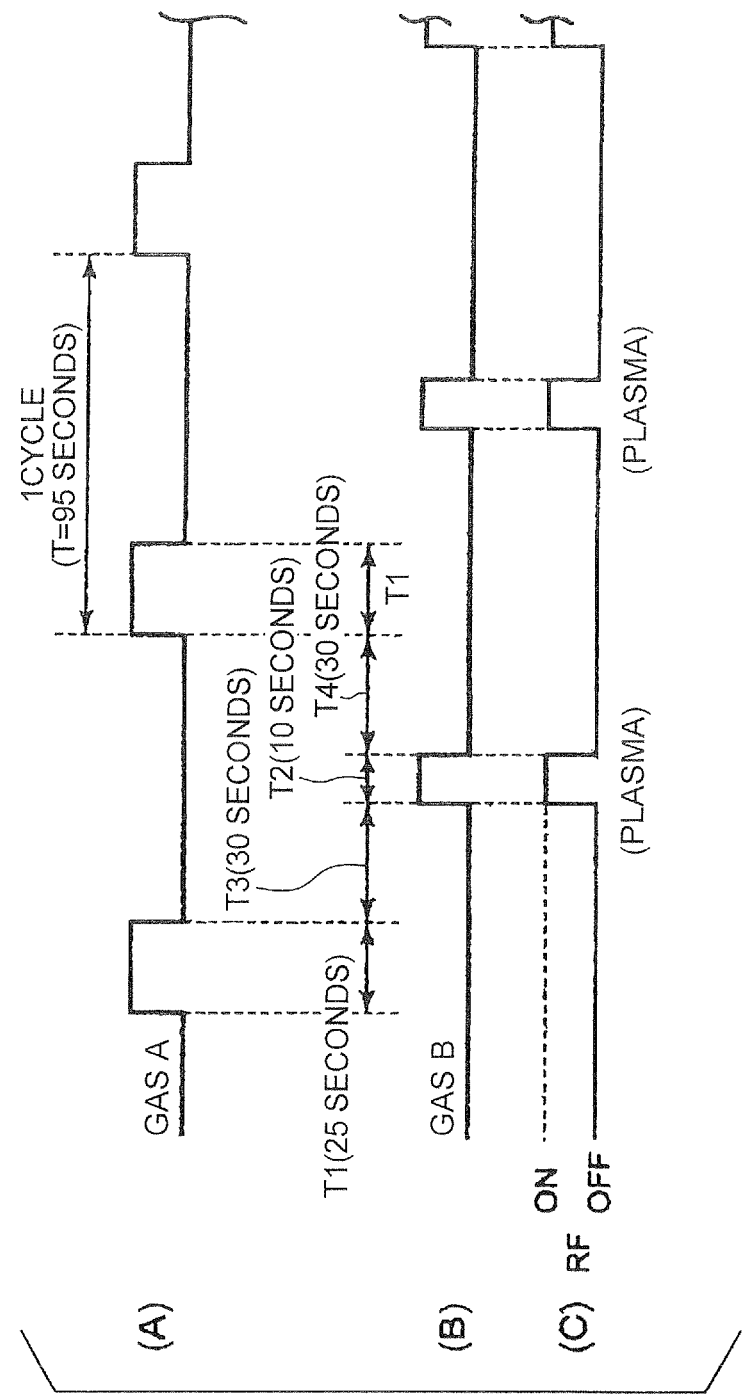
FIG. 6 is a timing chart showing the timing of supply of gases under conditions 2.
Figure 7:
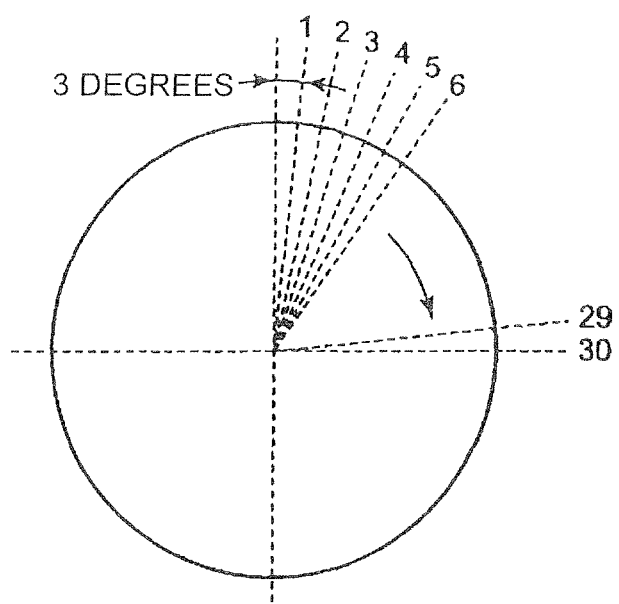
FIG. 7 is a diagram illustrating the shifting of a gas supply starting position during 30 cycles, the shift being 3 degrees in each cycle.

The basic concept of the first embodiment of the present invention is as follows. FIG. 4 is a diagram illustrating a relationship between an arbitrarily set repetition number P for ALD cycles and optimum gas supply starting positions; FIG. 5 is a diagram illustrating the shifting of a gas supply starting position as viewed from a substrate; FIG. 6 is a timing chart showing the timing of supply of gases under conditions 2; and FIG. 7 is a diagram illustrating the shifting of a gas supply starting position during 30 cycles, the shift being 3 degrees in each cycle.

First, the relationship between the timing of supply of a gas and the rotational speed of a substrate will be described with reference to FIG. 4 which illustrates the cases of different numbers K (K is a natural number greater than 1) of gas supply starting positions as viewed from the center of a substrate and in which a circle is equally divided into K segments for easy understanding of the invention.

As described previously, a wafer boat (substrate) rotates through the following angle θ (radian) during one ALD cycle T (sec) (time from the start of supply of a gas A to the start of the next supply of the gas A):

$$\theta=(1/60)\cdot N \times T \times 2\pi (\text{radian}) \quad (1)$$

where N represents the rotational speed (rpm) of the wafer boat (substrate).

With reference to the relationship between a substrate and a gas supply position in an ALD process performed by repeating ALD cycles P times (P is a natural number greater than 1), gas supply positions are preferably distributed in the circumferential direction of the substrate with respect to the center of the substrate such that the entire circumference of the substrate is equally divided by the gas supply positions in order to enhance the in-pane uniformity of the thickness of a film. FIG. 4 shows the optimum gas supply starting positions when the division number K is 2, 3 or 4. For simplification, it is assumed that P is equal to K, and a single gas is supplied from one gas supply port lying lateral to the substrate.

In FIG. 4, the numbers 1, 2, 3 and 4 indicate relative gas supply starting positions as viewed from the substrate (the center of the substrate). Instead of rotating the substrate, it is possible to rotate the gas supply port (corresponding to a gas jet port) around the substrate. Thus, it is possible to rotate the dispersing nozzles 34, 36 around the wafer boat 12 which is fixed.

As is apparent from the illustrated relationship, in an ALC process performed with the repetition number P (natural number greater than 1), it is preferred to set K gas supply starting positions and to shift the gas supply starting position by 1/P (=1/K) revolution for every ALD cycle as shown in FIG. 5. This can equalize the gas supply starting positions with respect to the substrate, making it possible to eliminate the dependency on gas supply direction upon the formation of a film. The K gas supply starting positions are determined by equally dividing the entire circumference of the substrate into K segments.

Though the gas supply direction is shifted in a clockwise direction in FIG. 5, counterclockwise shifting is, of course, possible. As shown in FIG. 5, a gas supply starting position is sequentially shifted in the circumferential direction of a substrate for every cycle in such a manner that the entire circumference of the substrate is equally divided into P segments, and the gas supply starting position is shifted by one segment for every cycle.

Thus, in an ALD process in which an ALD cycle is repeated P times, a substrate rotates through the following angle θ during the period T of one ALD cycle, i.e. the time from the start of supply of a gas A to the start of the next supply of the gas A, on the assumption that the substrate makes (n+1/K) revolutions, i.e. n revolutions plus 1/K revolution, or (n−1/K) revolutions during the cycle period T:

$$\theta=(n\pm 1/K)\times 2\pi (\text{radian}) \quad (2)$$

In the expression, n represents a natural number. When n=2, the substrates makes 2 revolutions plus 1/K revolution. The following relational expression can be derived from the expression (2) and the above-described expression (1):

$$(n\pm 1/K)=(1/60)\cdot N \times T \quad (3)$$

where N represents the relative rotational speed between the substrate and a gas supply port (gas supply starting position).

In the expression, 2π has been deleted from both sides.

Therefore, by setting the period T of one ALD cycle and the relative rotational speed N between a substrate and a gas supply port, the N and T satisfying the expression (3), in an ALD process in which an ALD cycle is repeated P times, K gas supply starting positions (gas supply starting directions) can be set as viewed from the center of the substrate, and the actual gas supply starting position can be shifted between the K positions by 1/K revolution for every cycle. Accordingly, a gas can be supplied uniformly to the substrate without overlap of gas supply starting positions during the film forming process. It therefore becomes possible to overcome the non-uniformity of the thickness of a film due to the dependency on gas supply direction upon the formation of the film.

The method of controlling the rotational speed of a substrate and a gas supply starting position in such a manner as to satisfy the expression (3) is hereinafter referred to as "equal division supply method" for convenience. The above-described number K is referred to as "division number", and the angle around the center of a substrate through which a gas supply starting position is shifted for every cycle, for example the central angle formed when it is shifted from "1" to "2" or from "2" to "3", shown in FIG. 5, is herein referred to as "shift angle".

The equal division supply method as performed with the timing of supply of gases under conditions 2, shown in FIG. 6, will now be described. As with the case of FIG. 3, a high-frequency voltage is applied upon the supply of a gas B ($NH_3$).

Though a gas A is supplied from two supply ports in the above-described embodiment, it is assumed here that a gas, converging from two ports, is supplied from one port. It is also assumed that a gas A supply position and a gas B supply position do not change relative to each other.

Under the conditions 2, the period T1 for supplying the gas A (e.g. DCS gas) in the adsorption step is 25 seconds; the period T3 for evacuating and purging the interior of the processing container while stopping the supply of the gas A is 30 seconds; the period T2 for supplying the gas B (e.g. $NH_3$ gas) in the reaction step (nitridation step) is 10 seconds; and the period T4 for evacuating and purging the interior of the processing container while stopping the supply of the gas B is 30 seconds.

Assuming that the rotational speed N1 of a substrate is 1.9 (rpm), the number m of revolutions, m=θ/2π, of the substrate during the ALD cycle T=95 sec under the conditions 2, can be calculated from the above expression (1) as follows:

$$m=\theta/2\pi=(1/60)\times 1.9 \times 95=3+1/120$$

Thus, the substrate makes 3 revolutions plus 1/120 revolution during one ALD cycle. The number m of revolutions of the substrate during 120 ALD cycles is: m=120×(3+1/120)=361. Accordingly, the gas supply cycle synchronizes with the substrate rotation period for the first time after 120 ALD cycles. That is, they do not synchronize during 119 ALD cycles. When the required thickness of a film is not more than 100 Å and one atomic layer, having a thickness of about 1 Å, is formed in one ALC cycle, at most 100 ALC cycles are necessary to form the intended film. Taking now the case of forming a 30 Å film on a substrate, a gas supply starting position (gas supply starting direction) is shifted by 3 degrees (corresponding to 1/120 revolution) for each cycle, and 90 degrees in the total of 30 cycles, as viewed from the center of the substrate, as shown in FIG. 7.

As will be appreciated from this, when forming a film at a wafer rotational speed of 1.9 rpm by a 30-cycle ALD process under the conditions 2, the gas supply starting positions during the process concentrate in the right upper 90-degree area of the wafer although the gas supply cycle does not synchronize with the wafer rotation period. This may result in non-uniform film thickness due to the dependency on gas supply starting position upon the formation of the film. The results are similar to those described in paragraph 0027 of the prior art document 4, stating that uniformity of the thickness of a film cannot be obtained when a wafer rotation period synchronizes with a gas supply cycle.

Thus, in an ALD film forming process, it is insufficient merely to make a gas supply cycle non-synchronous with a boat rotation period. Especially when forming a thin film by ALD, the repetition number of ALD cycles is small. Therefore, if the shift angle of gas supply starting position for each ALD cycle is small as in the conditions 2, localization of the gas supply starting position may occur, resulting in non-uniform film thickness due to the dependency on gas supply starting position upon the formation of the film.

First Embodiment

An ALD film forming process comprising 30 ALD cycles, carried out under the above-described conditions 2 using the film forming apparatus 2 of the present invention, will now be described. First, operating conditions for the apparatus are inputted into the control means 48 in advance. In particular, a processing recipe containing data on the conditions 2 and the division number K which determines the number of processing gas supply starting directions, in addition to data on the processing temperature, the processing pressure, the gas flow rate, etc., is inputted by an operator from the processing condition input means 48A connected to the control means 48. Alternatively, such a processing recipe may be sent to the control means 48 from a host computer. The control means 48 determines a rotational speed which satisfies the division number K specified by a stored program. Assuming that "30" is specified as the division number K by the processing recipe, the substrate rotational speed N1 relevant to the division number can be calculated as follows by the control means 48. The advantageous effects of the present invention can be achieved by rotating the wafer boat 12 at the rotational speed N1 at predetermined timing by means of the drive mechanism 21.

[Calculation]

With the cycle period T=95 sec in the conditions 2, the following expression is derived from the above expression (3):

$$(n \pm 1/30) = (1/60) \cdot N1 \times 95$$

Therefore $N1 = 60/95 \cdot (n \pm 1/30)$

When n=1, N1 is calculated as follows:

$$N1 = 60/95 \cdot (1 \pm 1/30) = 2(30 \pm 1) \cdot (1/95)$$

When "+" is selected in the above expression, $N1 = 62/95$ rpm=0.6526 rpm.

The number m of revolutions, $m = \theta/2\pi$, of a substrate during one ALD cycle can be calculated from the above expression (1) as follows:

$$m = \theta/2\pi = (1/60) \times (62/95) \times 95 = 31/30 = (1 + 1/30) \text{ revolution}$$

Thus, the substrate makes one revolution plus 1/30 revolution. As viewed from the substrate, a gas is supplied from 30 equally-spaced gas supply starting positions sequentially in 30 cycles. In other words, a gas supply starting position (gas supply starting direction) is relatively and sequentially shifted in the circumferential direction of the substrate by 1/30 of the entire circumference every time one-cycle film forming processing is carried out. By thus setting gas supply starting positions at a specified division number during the film forming process, it becomes possible to prevent non-uniform film thickness due to the dependency on gas supply direction upon the formation of the film.

When "−" is selected in the above expression, N1=58/95 rpm=0.6105 rpm. The number m of revolutions, $m = \theta/2\pi$, of a substrate during one ALD cycle can be calculated from the above expression (1) as follows:

$$m = \theta/2\pi = (1/60) \times (58/95) \times 95 = 29/30 = (1 - 1/30) \text{ revolution}$$

Thus, the substrate makes one revolution minus 1/30 revolution. Therefore, the same effect as described above can be achieved.

The rotational speed N1 can be doubled, tripled, quadrupled . . . by changing the number n as 2, 3, 4 . . . Though a plurality of rotational speeds is possible calculationally, an actual speed may be determined as follows: A speed range which does not affect the rotation of wafers in an actual process, for example, a speed range in which wafers do not move in the wafer boat or a speed range which does not cause a mechanical resonance due to the structure of the apparatus, is determined in advance. A rotational speed N1 which is closest to such a range can be selected as an actual control speed.

When a calculated rotational speed N1 has a decimal fraction, e.g. when N1=58/95 rpm=0.6105 rpm, control may be performed either such that the speed 0.610 rpm and the speed 0.611 rpm are alternately repeated, or such that the average of a plurality of rotational speeds is 0.6105 rpm.

Figure 8:
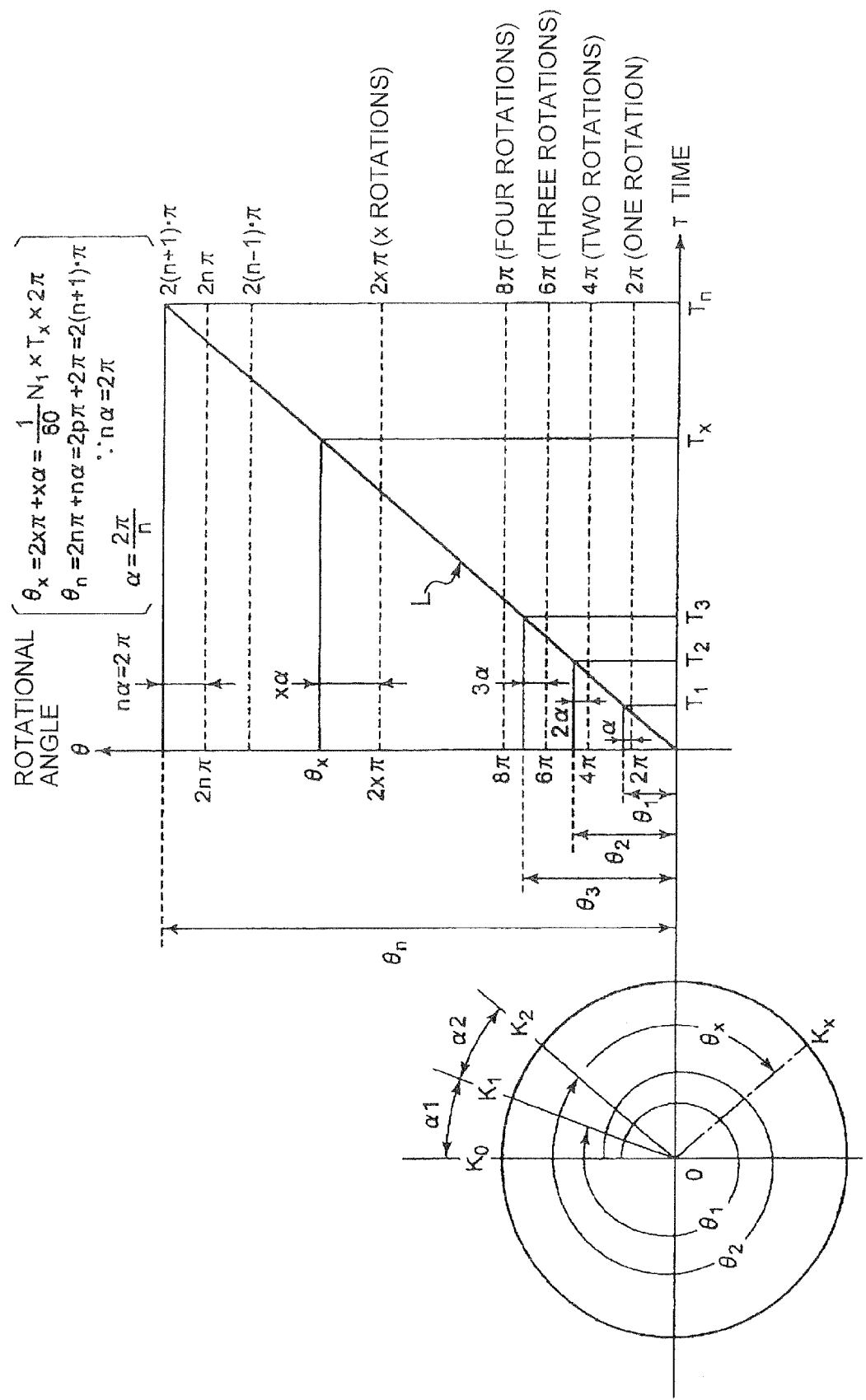
FIG. 8 is a diagram showing a relationship between the shift angle of a gas supply starting position with respect to a substrate and a rotational angle θ (radian) in each ALD cycle in the equal division supply method.

FIG. 8 shows a relationship between the shift angle of a gas supply starting position with respect to a substrate and a rotational angle θ (radian) in each ALD cycle in the equal division supply method. The left-hand diagram of FIG. 8 shows gas supply starting positions K0, K1, K2 . . . with respect to the substrate. The shift angle α is constant if the product of the rotational speed N (rpm) and the ALD cycle (time from the start of supply of a gas A to the start of the next supply of the gas A) T (sec), N·T, is constant. The right-hand diagram (graph) of FIG. 8, in which the abscissa represents time T and the ordinate represents the rotational angle θ, shows ALD cycles on the abscissa axis where T1=first cycle, T2=second cycle, . . . , Tx=Xth cycle, Tn=nth cycle (n is the division number). The graph shows on the ordinate axis rotational angles θ1, θ2, . . . , θn (in the range of 0 to 2(n+1)π radians) after the first cycle (i.e. after T1 seconds), the second cycle, . . . , nth cycle.

The following expression can be derived from the above expression (1):

$$\theta x = (1/60) \cdot N1 \times Tx \times 2\pi \quad (5)$$

When N1 is a fixed value, there is a linear relationship between θ and T as shown by the straight line L on the graph.

Figure 9:
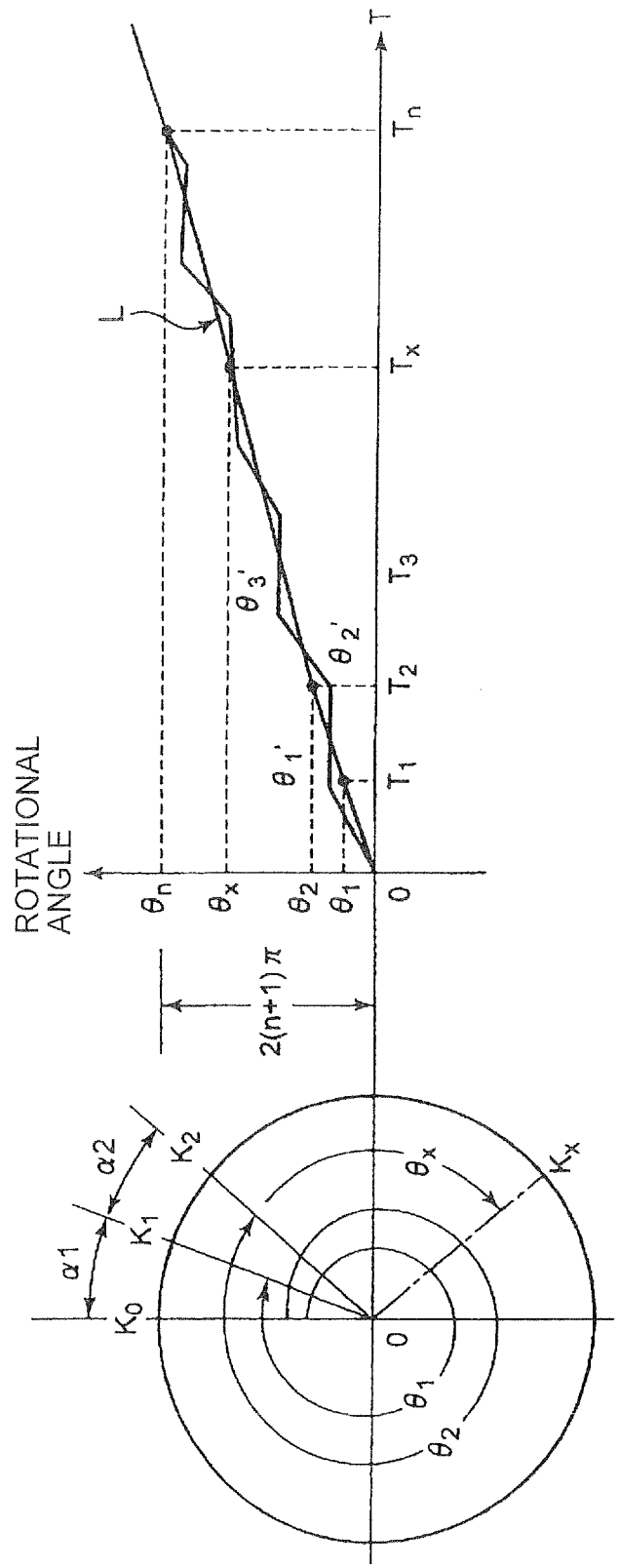
FIG. 9 is a diagram showing a relationship between the shift angle of a gas supply direction and a rotational angle in each ALD cycle as observed when the rotational angle is changed.

The line L is a calculational ideal line in the equal division supply method. FIG. 9 shows a relationship between the shift angle of a gas supply direction and a rotational angle in each ALD cycle as observed when the rotational angle is changed. Even when the rotational angle θ is alternately increased and decreased to a certain degree from the line L, or changed such that an increase and a decrease are canceled out in the overall cycle, as shown by the polygonal line (θ1', θ2', θ3'...) in FIG. 9, the effect of the equal division supply method, i.e. prevention of the in-plane non-uniformity of the thickness of a film due to the dependency on gas supply direction upon the formation of the film, can be obtained.

As will be appreciated from the above expression (5), the rotational speed N or the ALD cycle T may be alternately increased and decreased to a certain degree. Thus, instead of a calculated rotational speed, it is possible to use a numerical value obtained by rounding off a decimal number of the calculated value. Further, when a calculated rotational speed N1 has a decimal fraction, e.g. when N1=58/95 rpm=0.6105 rpm, control may be performed either such that the speed 0.610 rpm and the speed 0.611 rpm are alternately repeated, or such that the average of a plurality of rotational speeds is 0.6105 rpm.

The effect of the equal division supply method, i.e. prevention of the in-plane non-uniformity of the thickness of a film due to the dependency on gas supply direction upon the formation of the film, can be obtained also by selecting the rotational angles θ1', θ2', θ3' . . . , shown in FIG. 9, so that those angles, when averaged, approximate the line L. In this case, as will be appreciated from the above expression (5) and as described above, the rotational speed N or the ALD cycle T may be corrected. Though the shift angles α1, α2 . . . cannot be equal, the technical concept of the present invention can be achieved by making the average of the shift angles approximately equal to the calculational shift angle in the equal division supply method. This means that when in an ALD process, consisting of n cycles, the Kth rotational angle is equal to an integral multiple of 2π, the average of the shift angle (1/60·Tx·Nx·2π) in each cycle is equal to 2(n+1)π/K (Tx represents the gas supply cycle, i.e. the time from the start of supply of a gas to the start of the next supply of the gas, and Nx represents the relative speed (rpm) of a substrate in each cycle).

While the relationship between the shift angle of a gas supply starting position with respect to a substrate and a rotational angle θ (radian) in each ALD cycle in the equal division supply method has been described with reference to FIG. 8, the relationship is merely a specific example of the control method according to the present invention. The inventive concept broadly involves using a function f containing at least two variables, a rotational speed N and a gas supply cycle T, to determine a gas supply starting position as viewed from the center of a substrate in each cycle of P cycles and perform control of the shifting of the gas supply starting position. The use of the same shift angle in each cycle facilitates control of the shift. However, other control manners are also required to meet the increasing demand for finer devices, increased yield and larger substrates. In this connection, a significant feature of the present invention resides in feeding back the results of the formation of a film to the film forming apparatus by using the function f, which cannot be performed by the prior art technique of merely setting a substrate rotation period to be non-synchronous with a gas supply cycle. In order to fully perform the feedback control, it is necessary to use not a proportional division based on a simple linear model but a division based on a function having a higher degree of freedom. For example, when the results of the formation of a film reveal a difference in the film thickness in a particular direction on the substrate, it is possible to increase the division number in that direction in order to eliminate the difference in the film thickness. The method of the present invention makes it possible to prevent not only non-uniform film thickness due to the dependency on gas supply direction, but also the in-plane non-uniformity of film thickness which may be caused by other various factors.

In the above-described first embodiment, an ALD cycle T, i.e. a gas supply cycle, is treated as a fixed numerical value, whereas a rotational speed N is changed to arbitrarily change the number of gas supply starting positions. However, it is also possible to treat a rotational speed N as a fixed numerical value while changing an ALD cycle T, i.e. a gas supply cycle. When carrying out the method of the present invention by using a film forming apparatus having an automatic calculation function, a rotational speed, having a large number of decimal places, does not cause any problem. Such a numerical value, however, can be problematic when determining a numerical value by hand calculation, and inputting only the numerical value obtained into the control means of a film forming apparatus. For example, some apparatuses have a limitation on the number of decimal places for numerical values to be inputted. In the case of such an apparatus, a rotational speed may be fixed while controlling an ALD cycle T.

Second Embodiment

An ALD film forming process comprising 30 ALD cycles, carried out at a fixed rotational speed while controlling an ALD cycle time T under the above-described conditions 2, using the film forming apparatus 2 of the present invention, will now be described.

First, as with the first embodiment, operating conditions for the apparatus are inputted into the control means 48 in advance. The control means 48 can change an ALD cycle time T, e.g. by adjusting the time for evacuating and purging the processing container, without changing the order of supply of reactive gases, the time for supply of each gas and the amount of each gas supplied, which are specified in the operating conditions. When K=30 and the substrate rotational speed N1=1.9 (rpm), the period T1 of one ALD cycle is determined by the control means 48 through the following calculation. Processing gases can be supplied at predetermined appropriate timings, whereby the advantageous effects of the present invention can be achieved.

[Calculation]

The following expression is derived from the above expression (3):

$$(n\pm 1/30)=(1/60)\times 1.9 \times T1$$

Therefore T1=60/1.9×(n±1/30)

When n=2 (when n=1, T1 is less than 50 seconds and cannot satisfy the intended operating conditions, and therefore n cannot be 1), T1 is as follows:

$$T1=60/1.9\times(2\pm 1/30)=2(60\pm 1)\times(1/1.9)$$

When "+" is selected in the above expression, T1=122/1.9=64.210 (sec). Such cycle period is possible e.g. by shortening the purge periods T3 and T4 from 30 seconds to 14.605 seconds.

The number m of revolutions, m=θ/2π, of a substrate during one ALD cycle can be calculated from the above expression (1) as follows:

$$m=\theta/2\pi=(1/60)\times(1.9)\times 122/1.9=61/30=(2+1/30)\text{revolutions}$$

Thus, the substrate makes 2 revolutions plus 1/30 revolution. As viewed from the center of the substrate, a gas is supplied from 30 equally-spaced gas supply starting positions sequentially in 30 cycles. This makes it possible to prevent non-uniform film thickness due to the dependency on gas supply direction upon the formation of the film.

When "−" is selected in the above expression, the substrate makes one revolution minus 1/30 revolution. Therefore, the same effect as described above can be achieved.

When n=3, T1 can be calculated as follows:

$$T1=60/1.9\times(3\pm1/30)=2(90\pm1)\times(1/1.9)$$

When "+" is selected in the above expression, T1=182/1.9=95.789 (sec). Therefore, the number m of revolutions, m=θ/2π, of a substrate during one ALD cycle can be calculated from the above expression (1) as follows:

$$m=\theta/2\pi=(1/60)\times(1.9)\times182/1.9=91/30=(3+1/30) \text{ revolutions}$$

Thus, the substrate makes 3 revolutions plus 1/30 revolution during one ALD cycle e.g. when the sum of the periods T3 and T4, which are the purge times under the conditions 2, is increased by 0.789 seconds. As viewed from the center of the substrate, a gas is supplied from 30 equally-spaced gas supply starting positions sequentially in 30 cycles. This makes it possible to prevent non-uniform film thickness due to the dependency on gas supply direction upon the formation of the film.

Because the substrate makes 3 revolutions plus 0.03333 revolutions, the shift angle θ1 is as flows: θ1=0.03333×360 (degrees)=12 (degrees). As will be appreciated from the foregoing, a plurality of ALD cycle periods T1 is possible calculationally. A cycle period T1, which is closest to an actual ALD cycle of gas supply/evacuation/purging, may be selected as an actual control period.

Some ALD processes have a large number, such as one thousand, of repeating cycles. When an ALD film forming process, whose number P of cycles is e.g. 1000, is carried out by the equal division supply method under the conditions 2, a substrate rotational speed can be calculated as follows:

The following expression is derived from the above expression (3) when substituting K=1000 and T=95 into it: (n+1/1000)=95/60×N. The rotational speed N can be determined as follows:

When $n=1, N=(1001\times60)/(1000\times95)=0.6322105$ (rpm)

When $n=2, N=(2001\times60)/(1000\times95)=1.2637894$ (rpm)

When $n=10, N=(10001\times60)/(1000\times95)=6.31642$ (rpm)

The shift angle is K/1 revolution=1/1000 revolution, and is equal to 0.36 degrees. The shift angle is constant irrespective of the value of n.

The shift angle is thus very small in an ALD film forming process whose repletion number P of cycles is large. When the shift angle is smaller than the below-described step angle of a pulse motor, it is possible to divide 1000, the repetition number P of ALD cycles, into 5 groups of 200, and to repeat a 200-cycle ALD process, performed by the equal division supply method with the division number K=200, five times. This makes it possible to prevent non-uniform film thickness due to the dependency on gas supply direction upon the formation of the film An ALD process comprising a large repetition number P of cycles as described above, performed according to the present invention, is generalized as follows: When repeating P times (P is a natural number greater than 1) a cycle, consisting of a supply period for supplying at least one gas and a supply stop period during which the supply of the gas is stopped, control is performed so that as viewed from the center of a wafer, a gas supply starting position is sequentially shifted in the circumferential direction of the wafer for every cycle in such a manner that the entire circumference of the wafer is divided into K segments (K is a natural number, K≤P), and the gas supply starting position is shifted by one segment for every cycle. With reference to the expression K≤P, the case of K=P where the division number K is equal to the repetition number P has been described above.

Thus, using one of the devisors of the repetition number P of ALD cycles (excluding P and 1) as a division number K, control may be performed such that a wafer W is rotated by P/K revolutions. When the repetition number P of ALD cycles is 100, for example, the divisional number K may be set at one of the devisors of "100" (excluding 100 and 1), i.e. "2", "4", "5", "10", "20", "25" and "50". When "5", for example, is selected as the division number K, a wafer is rotated 20 (=P/K=100/5) revolutions during the film forming process.

Figure 10:
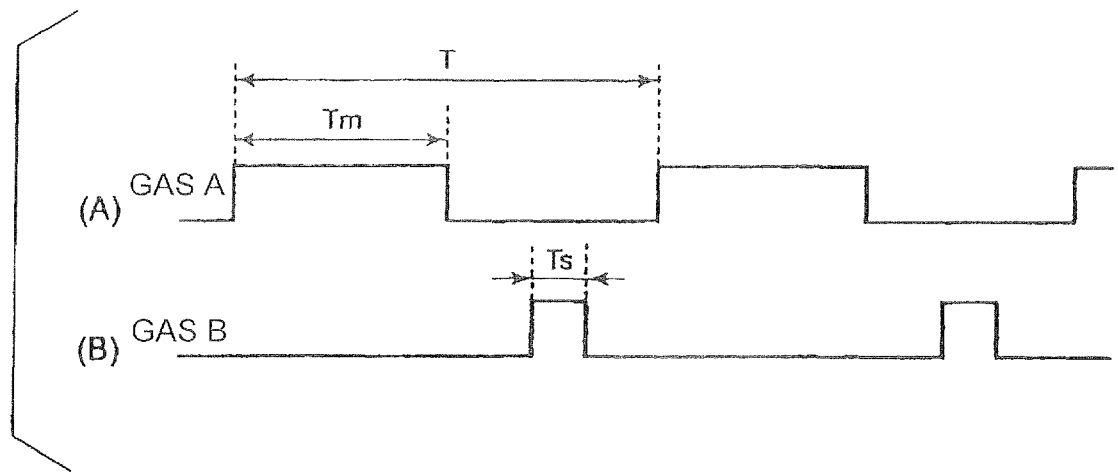
FIG. 10 is a graph showing the timing of supply of a gas A and a gas B in an ALD cycle.

A relationship between the timing of supply of a gas and the rotational speed of a wafer will now be described with reference to the generalized timing graph of FIG. 10. FIG. 10 illustrates an ALD process in which in a cycle period T, a gas A is first supplied for a time Tm, and then a gas B is supplied for a time Ts. There is no overlap between Tm and Ts, and Tm>Ts.

In the ALC process, the first gas A is jetted toward a wafer for Tm seconds to adsorb the gas A onto the wafer, followed by vacuum purging to evacuate the gas A. Thereafter, the second gas B is jetted toward the wafer for Ts seconds to adsorb the gas B onto the wafer. Such operations are performed repeatedly. The adsorption of the gas B, supplied for the shorter time, causes a reaction on the wafer surface, producing a one-atomic layer film.

With reference to the relationship between the gas A supplied for the longer time and the rotational speed N of the wafer, the following relational expression is derived from the above expression (1):

$$\theta L=(Tm\cdot N)\times(1/60)\times2\pi$$

where θL represents the rotational angle during the time Tm during which the gas A is supplied.

When θL is more than one revolution, the gas A is to be supplied to the substrate a plurality of times. Whether one-time supply of a gas is sufficient for complete adsorption of one atomic layer depends on the adhesion probability of the gas, the pressure, the gas exposure time, etc. Supplying the gas A an excessive number of times is inefficient because not all the gas supplied contributes to an ALD reaction. Four-time supply of the gas is herein deemed as the limit to keep on the safe side.

Therefore $\theta L\le2\pi\times4$

Therefore $\theta L=(Tm\cdot N)\times(1/60)\times2\pi\le8\pi$

N can be expressed as follows:

$$N\le240/Tm \tag{8}$$

Thus, N is not more than 240 times the reciprocal of the time for supply of the gas which is supplied for the longest time of those gases which contribute to the formation of a film.

When carrying out a 1000-cycle ALD film forming process under the conditions 2, Tm=25. Therefore, from the above expression (8), $N \leq 240/Tm=240/25=9.6$. Further, the rotational speed N can be calculated as follows:

When $n=15, N=(1500 \times 60)/(1000 \times 95)=9.47$(rpm)

This value is the maximum value.

When $n=16, N=(1600 \times 60)/(1000 \times 95)=10.10$(rpm)

This value does not satisfy the above expression (8). When n is not less than 16, the rotational speed N exceeds the upper limit of the above expression (8) and is undesirable in the efficiency of the use of a gas.

In the embodiment of the present invention, the wafer boat is rotated by the rotating shaft 20 by means of the drive mechanism 21, e.g. comprised of a pulse motor such as a stepping motor, which is capable of accurate positioning and indexing, mounted to the front end of the arm 26 which is supported by the lifting mechanism (not shown), such as a boat elevator. With reference to stepping motors, a two-phase stepping motor, a five-phase stepping motor, etc. are currently commercially available. A two-phase stepping motor generally has a step angle of 1.8 degrees, operates at 200 pulses per revolution and can accurately control a rotational angle with a pulse number. A five-phase stepping motor generally has a step angle of 0.75 degrees, operates at 480 pulses per revolution and can accurately control a rotational angle with a pulse number. Stepping motors having an increased resolution have been developed recently. Further, the use of a servo motor can achieve a higher resolution. For example, NX-series servo motors, available from Oriental Motor Co., Ltd., have a resolution of 100 to 100,000 (degree/pulse) in the catalog. It is also possible to increase the apparent resolution of a motor by changing, e.g. decreasing, the speed by means of a transmission e.g. comprised of gears; however, there is an upper limit to the resolution. In view of this and in order to facilitate control of the rotation of the wafer boat by means of a motor, it is possible to use a method of making a shift angle equal to an integral multiple of the step angle of a motor in the equal division supply method of the present invention, as described below.

When an initial shift angle, determined from the repetition number P of ALD cycles in the equal division supply method of the present invention, is not equal to an integral multiple of the step angle of a pulse motor, a complicated control of the pulse motor is needed. A countermeasure in this regard will now be described.

Figure 11:
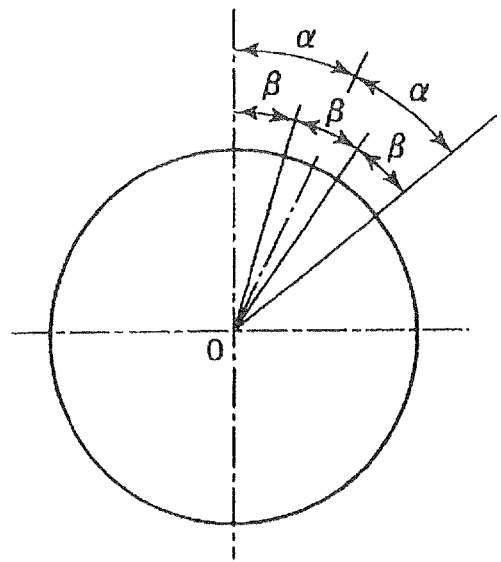
FIG. 11 is a diagram showing the relationship between a shift angle α and a step angle β when the ratio R of a division number K to a resolution Q is 2/3.

The shift angle $\alpha=360°/K$ (K is the division number). The resolution of a motor is here defined as a pulse number Q required for one revolution of a motor shaft. In the case of a two-phase stepping motor having a step angle of 1.8 degrees, the resolution Q=200 (360 degrees/200=1.8 degrees). The step angle $\beta$ of the motor is: $\beta=360°/Q=1.8$ degrees. FIG. 11 shows the relationship between a shift angle $\alpha$ and a step angle $\beta$ in the case where the resolution Q is larger than the division number K, in particular when the ratio R of the division number K to the resolution Q, $R=K/Q$, is 2/3.

The shift angle $\alpha$ and the step angle $\beta$ satisfy the relation: $R \cdot \alpha = \beta$, i.e., $(K/Q) \cdot \alpha = \beta$. Thus, the following expression holds:

$$K \cdot \alpha = Q \cdot \beta \qquad (9),$$

where K and Q do not have any common factor.

The expression (9) holds also when Q<K.

When the division number K=160 and the resolution Q=200, the initial shift angle $\alpha=360/160=2.25°$ (not equal to an integral multiple of the step angle). Therefore, the ratio R can be calculated as follows:

$$R=K/Q=160/200=4/5$$

Further, the following expression can be derived from the above expression (9):

$$4 \cdot \alpha = 5\beta$$

When the step angle $\beta=1.8°$, $5 \cdot \beta = 5 \times 1.8° = 9°$.
When $4 \cdot \alpha$ is taken as a new shift angle, $4 \times 2.25° = 9°$. Therefore, a new division number is 360/9=40.

By using the equal division supply method with K' set at 40, a shift angle adapted to the resolution Q of the motor and a relationship between a rotational speed N and an ALD cycle T, which can achieve the shift angle, can be derived.

An integral multiple of the new shift angle $\alpha'$ is also adapted to the resolution Q of the motor. When such a shift angle $(n \times \alpha')$ is set, the division number will be K'/n.

In summary, provided that the resolution of a motor is defined as a pulse number Q required for one revolution of a motor shaft, the division number K, the shift angle $\alpha$ (360°/K), the step angle $\beta$ of the motor and the resolution Q satisfy the expression (9) when the shift angle $\alpha$ is not equal to an integral multiple of the step angle $\beta$:

$$K \cdot \alpha = Q \cdot \beta \qquad (9),$$

where K and Q do not have any common factor.

The value "$K \cdot \alpha = Q \cdot \beta$" is used in the equal division supply method as a new shift angle $\alpha'$ which is equal to an integral multiple of the step angle. This can facilitate control of the rotation of the motor.

It is also possible to use an integral multiple of $\alpha'$ ($n\alpha'$) as a new shift angle and K'/n as a new division number.

When a transmission mechanism is interposed between the motor and the rotating shaft 20, and the transmission gear ratio is 1/G (G revolutions of the motor per revolution of the rotating shaft 20), it is also possible to newly set an equally-divided central angle (shift angle) which is equal to 1/G of the above shift angle (equally-divided central angle).

Third Embodiment

Using the above-described relation, an ALD cycle time Tx can be determined in the case where K=160, the resolution Q of the motor used is 200 and the rotational speed N is rounded to the whole number in the timing graph of conditions 2, as follows:

$$R=K/Q=160/200=4/5$$

The following expression can be derived from the above expression (9): $4 \cdot \alpha = 5 \cdot \beta$
When the step angle $\beta=1.8°$, $5 \cdot \beta = 5 \times 1.8° = 9°$.
When $4 \cdot \alpha$ is taken as a new shift angle, $4 \times 2.25° = 9°$.
Therefore, a new division number is 360/9=40.
The following relational expression can be derived from the above expression (3): $(n \pm 1/40)=(1/60) \times 2 \times Tx$ Table 1 below shows the values of n and Tx which satisfy this relational expression.

TABLE 1

|    |     | 1     | 2     | 3     | 4      |
|----|-----|-------|-------|-------|--------|
|    | n   |       |       |       |        |
| Tx | (+) | 30.75 | 60.75 | 90.75 | 120.75 |
|    | (−) | 29.25 | 59.25 | 89.25 | 119.25 |

The Tx value of 90.75 in the case of n=3, + can be used by shortening the ALD cycle time from 95 seconds to 90.75 seconds.

It is also possible to use the Tx value of 119.25 in the case of n=4, − and change the ALD cycle time from 95 seconds to 119.24 seconds.

When Tx is 90.75, θ1 can be calculated from the above formula (1) as follows:

θ1=90.75×2÷60=3.025

Thus, θ1 is equal to 3 revolutions plus 9° (0.025 revolutions) and satisfies the design.

Similarly, when Tx is 119.25, θ1 can be calculated as follows:

θ1=119.25×2÷60=3.975

Thus, θ1 is equal to 4 revolutions minus 9° and satisfies the design.

In the equal division supply method, when it is applied in an ALD process comprising P repetitions of an ALD cycle, the maximum value of the division number is P. If a division number larger than P is used, the total of shift angles comes short of 360 degrees. When the number of repetitions of ALD cycles is as large as 1000 as in the above-described case, it is possible to use, as a division number, a number which is equal to 1/n (n is a natural number) of the maximum division number, and to set a rotational speed or an ALD cycle time in the equal division supply method.

In the above-described embodiments, in view of the restriction of the resolution Q of a motor and in order to facilitate control of the rotation, the division number is corrected so that it becomes adapted to the step angle of the motor.

In the above-described embodiments, the shift angle can be made n-fold and the division number K can be made 1/n. The division number K is preferably large because of increased distribution of gas supply directions.

Fourth Embodiment

In the above-described embodiments the entire circumference of an object to be processed (substrate) is principally equally divided into K segments, and a gas supply starting position is shifted in the circumferential direction by 1/K of the circumference for every cycle. However, as has been set forth in paragraph 0072 of the present specification, it is also possible to unequally divide the entire circumference of an object to be processed depending on e.g. the distribution of the thickness of a film.

Thus, the fourth embodiment of the present invention is characterized in that when repeating P times (P is a natural number greater than 1) a cycle, consisting of a supply period for supplying at least one gas and a supply stop period during which the supply of the gas is stopped, control is performed so that as viewed from the center of an object to be processed, a gas supply starting position is sequentially shifted in the circumferential direction of the object to be processed for every cycle in such a manner that the entire circumference of the object to be processed is divided into at least two zones each having a specified central angle, and the gas supply starting position is shifted by a first angle α1 in the first angular zone and by a second angle α2, which is different from the first angle α1, in the second angular zone for every cycle.

In other words, when repeating P times (P is a natural number greater than 1) a cycle, consisting of a supply period for supplying at least one gas and a supply stop period during which the supply of the gas is stopped, control is performed so that as viewed from the center of a wafer as an object to be processed, a gas supply starting position is sequentially shifted in the circumferential direction of the wafer for every cycle in such a manner that the entire circumference of the above-described holding means is divided into a plurality of zones and the entire circumference of the wafer is divided into K segments (K is a natural number, K≤P), and that the gas supply starting position is shifted by one segment for every cycle, with the degree of shift of the gas supply starting position being different among the plurality of zones.

As described above with reference to FIGS. 1 and 2, in the common vertical CVD film forming apparatus, semiconductor wafers W are held in multiple stages at an approximately equal pitch by the support posts 12A of the quartz wafer boat 12 as a holding means during film forming processing. As described previously, the support posts 12A are disposed eccentrically and non-symmetrically with respect to the center of the boat so that wafers in a horizontal position can be inserted into the wafer boat 12 in one direction. Therefore, even when the wafer boat 12 is rotated during film forming processing, the supply of a gas is affected by the support posts 12A of the wafer boat 12, resulting in the in-plane non-uniformity of the thickness of a film formed on a wafer W, as reported by a number of prior art documents (see e.g. Japanese Patent Laid-Open Publication Nos. H03-263317 and 2003-007807).

Figure 12:
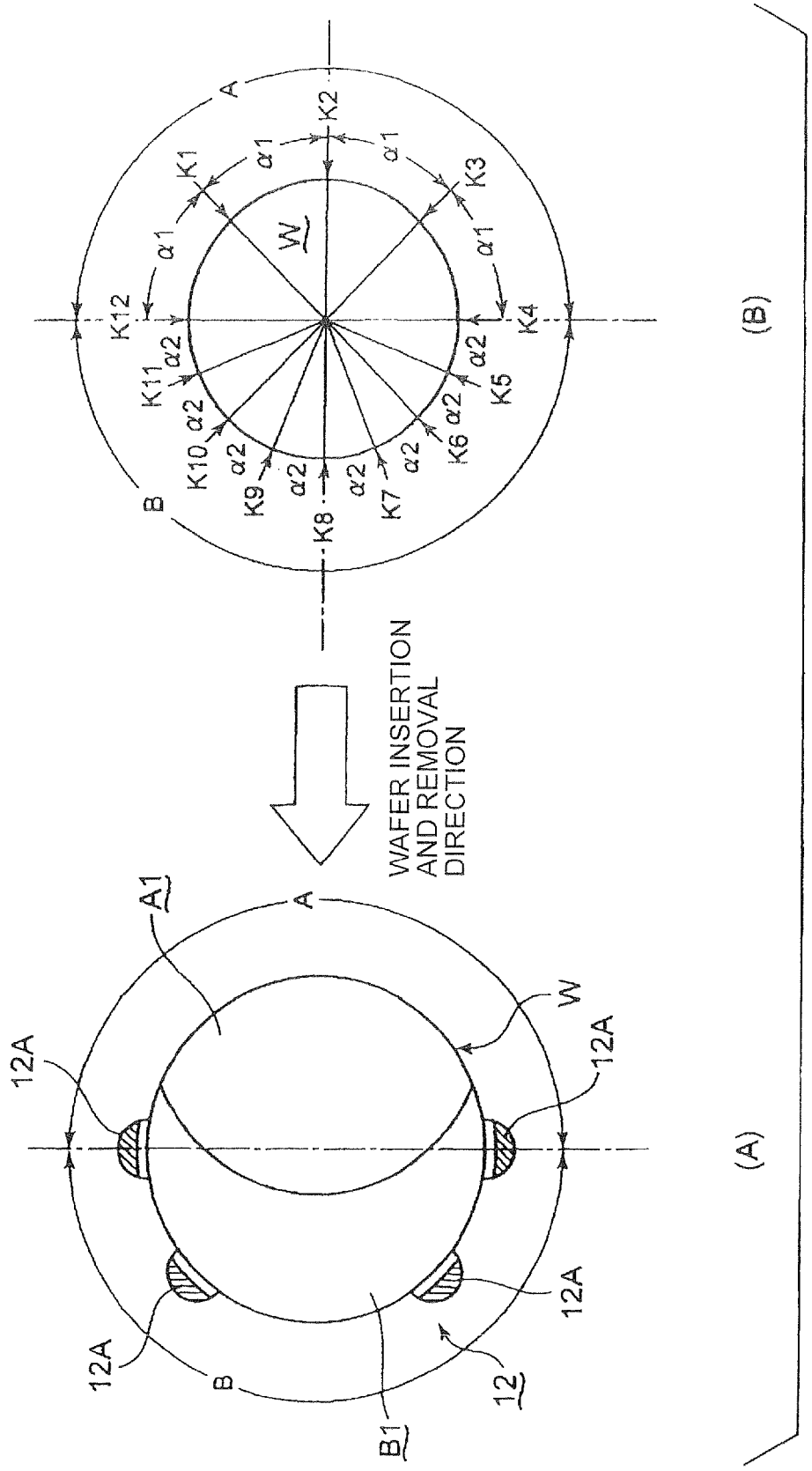
FIG. 12 is a diagram illustrating a fourth embodiment which divides the circumference of an object to be processed unequally among zones.

In particular, the support posts 12A are likely to obstruct diffusion of a film forming gas in those areas of a wafer which are close to the support posts 12A of the wafer boat 12, resulting in the formation of a thin film in those areas. In contrast, the thickness of a film tends to be large in those areas of the wafer which are remote from the support posts 12A. In such a case, it is desirable to provide a large number of gas supply starting positions for an approximately one-half zone of a wafer, close to the support posts 12A, so as to increase the thickness of a film in that area. This will be described in detail with reference to FIG. 12. FIG. 12 illustrates the fourth embodiment which divides the circumference of an object to be processed unequally among zones. FIG. 12(A) shows the support posts 12A of the wafer boat 12, a common distribution of the thickness of a film in a wafer W supported by the support posts 12A, and a direction in which the wafer W is inserted into the wafer boat 12. FIG. 12(B) shows division of the circumference of the wafer W into two zones: an angular zone A with a small division number and an angular zone B with a large division number, each zone having a central angle of 180 degrees. In FIG. 12, the same reference numerals are used for the same members or components as used in the preceding drawings, and a duplicate description thereof will be omitted.

As shown in FIG. 12(A), the four support posts 12A are arranged along a semicircular arc portion of the wafer W, and adjacent support posts 12A are coupled to each other and reinforced by a not-shown rib. The wafer boat 12 is generally formed of a high-purity heat-resistant material, such as silica glass. The area that corresponds to the other semicircular arc portion of the wafer W is open so that the wafer W can be inserted into or removed from the wafer boat 12 in a wafer insertion and removal direction.

There is no obstacle to the flow of a film forming gas in the angular zone A corresponding to the open semicircular arc area of a wafer W which is open to the wafer insertion and removal direction. Therefore, the thickness of a film tends to be relatively large in the zone A-side rugby ball-shaped area A1 of the wafer W. On the other hand, in the angular zone B corresponding to the other semicircular arc area of a wafer W, the support posts 12A obstruct the flow or diffusion of the film forming gas. Therefore, the thickness of a film tends to be relatively small in the zone B-side crescent-shaped area B1 of the wafer W.

In the fourth embodiment, in order to correct the non-uniformity of the thickness of a film, control is performed so that the degree of shift of the gas supply starting position is smaller in the zone B than in the zone A as shown in FIG. 12(B). In other words, the division number, i.e. the number of gas supply starting positions, is small in the zone A and large in the zone B. The degree of shift of the gas supply position is made constant in each of the zones A and B.

Thus, referring to FIG. 12(B), the entire circumference of a wafer W is divided into two angular zones A, B each having a central angle of 180°. During an ALD process comprising a number of repeating cycles, a gas supply starting position is shifted by the first shift angle α1 in the first angular zone A, and by the second shift angle α2 in the second angular zone B for every cycle. The shift angle α1 differs from the second shift angle α2.

The density of gas supply positions is changed between the angular zones A and B by thus changing the division number between the zones. This can change the growth rate of a film on the wafer W between the angular zones, thereby preventing non-uniform film thickness.

In particular, in the embodiment shown in FIG. 12(B), the division number for division of the entire circumference of the wafer W is set at 12, and the zone A-side semicircular arc is equally divided into 4 segments K1 to K4, and the other zone B-side semicircular arc is equally divided into 8 segments K5 to K12. Accordingly, the shift angle α1 of the gas supply starting position in the zone A is 45 degrees, while the shift angle α2 in the zone B is 22.5 degrees. Also in this embodiment, the shift of the gas supply starting position from K1 to K12 may be repeated a number of times.

To make the change of the shift angle, the length of one cycle may be changed by changing the period for purging a gas and/or the rotational speed of the wafer boat may be changed.

The generalized concept of the fourth embodiment will now be described. The division number of the angular zone A is represented by Ka and the division number of the angular zone B is represented by Kb; the total division number K=Ka+Kb.

Consider now the case where the density of the division number per the central angle in the angular zone A is taken as 1, and the density of the division number per the central angle in the angular zone B is made d (d is a positive number). The ratio d can be arbitrarily determined depending on variation in the state of a film formed.

The above conditions can be expressed as follows:

$$Ka+Kb=K \quad (11)$$

$$Ka/180:Kb/180=1:d \rightarrow Ka/Kb=1/d \quad (12)$$

Therefore Ka=Kb/d. When substituting this into the expression (11), the following expression is derived:

$$K=Kb/d+Kb=Kb(1+1/d)$$

Therefore Kb=d/(1+d)×K, Ka=1/(1+d)×K.

When K=12 and d=2 as in the embodiment shown in FIG. 12(B), Ka=1/(1+2)×12=4 and Kb=2/(1+2)×12=8.

Therefore, α1=180°/Ka=180°/4=45°, and α2=180°/Kb=180°/8=22.5°.

The following expression, which holds in the first four ALD cycles, can be derived from the above expression (3): n±1/4=(1/60)×T×N. A combination of T and N, which satisfies this relational expression, may therefore be selected in the first four ALD cycles.

The following expression, which holds in the fifth to twelfth ALD cycles, can be derived from the above expression (3): n±1/8=(1/60)×T×N. A combination of T and N, which satisfies this relational expression, may therefore be selected in the fifth to twelfth ALD cycles. By repeating a series of 12 ALD cycles, consisting of two cycle groups with different division numbers, until a predetermined cycle number is reached, an ALD film forming process can be performed by the method which involves dividing the entire circumference of a wafer W into the angular zone A with a small division number and the angular zone B with a large division number, each zone having a central angle of 180 degrees. The film forming method can increase the number of supplies of a gas to that area of the wafer W, shown in FIG. 12(A), which is affected by the support posts 12A, thereby increasing the thickness of a film in that area. This can enhance the in-plane uniformity of the thickness of the film.

Table 2 below shows (T×N) values for the angular zone A, determined by the above expression with varying n values.

TABLE 2

| | Angular zone A | | | |
|---|---|---|---|---|
| n | | 1 | 2 | 3 |
| T · N | (+) | 75 | 135 | 195 |
| | (−) | 45 | 105 | 165 |

Table 3 below shows values of the ALD cycle T relevant to Table 2, determined when the rotational speed N is set at 5 rpm.

TABLE 3

| | | | | Unit: sec |
|---|---|---|---|---|
| n | | 1 | 2 | 3 |
| T · N | (+) | 15 | 27 | 39 |
| | (−) | 9 | 21 | 33 |

N = 5 rpm

Similarly, Tables 4 and 5 below show (T×N) values and values of the ALD cycle T, respectively, for the angular zone B.

TABLE 4

| | Angular zone B | | | |
|---|---|---|---|---|
| n | | 1 | 2 | 3 |
| T · N | (+) | 67.5 | 127.5 | 187.5 |
| | (−) | 52.5 | 112.5 | 172.5 |

TABLE 5

| | | | | Unit: sec |
|---|---|---|---|---|
| n | | 1 | 2 | 3 |
| T · N | (+) | 13.5 | 25.5 | 37.5 |
| | (−) | 10.5 | 22.5 | 34.5 |

N = 5 rpm

Numerical values, close to the actual processing conditions, will be selected from the above Tables. It is also possible to change the rotational speed N while fixing the ALD cycle T. Alternatively, both the ALD cycle T and the rotational speed N may be changed.

It is, of course, necessary to investigate the relationship between the initial position of the wafer boat 12 at the start of the process and the first gas supply starting position in advance, and to first carry out a boat positioning step of rotating the wafer boat 12 through a predetermined angle for positioning of the angular zones A and B.

Fifth Embodiment

Consider now the case where the density of the division number Ka per central angle in the angular zone A having a central angle δ is taken as 1, and the density of the division number Kb per central angle in the angular zone B having a central angle γ is made d. The ratio d value can be arbitrarily determined depending on variation in the state of a film formed. The central angles δ, γ of the angular zones A, B are arbitrary, and the sum of the angles is 360°.

$$Ka+Kb=K \quad (11)$$

$$Ka/\delta:Kb/\gamma=1:d \rightarrow Ka/\delta=1/d\times(Kb/\gamma) \quad (13)$$

Therefore $Ka=1/d\times(Kb/\gamma)\times\delta$. When substituting this into the expression (11), the following expression is derived:

$$K=1/d\times(Kb/\gamma)\times\delta+Kb=Kb(1+\delta/\gamma d)$$

Therefore $Kb=d/(\delta/\gamma+d)\times K$, $Ka=1/(1+(\gamma/\delta)d)\times K$.

Figure 13:
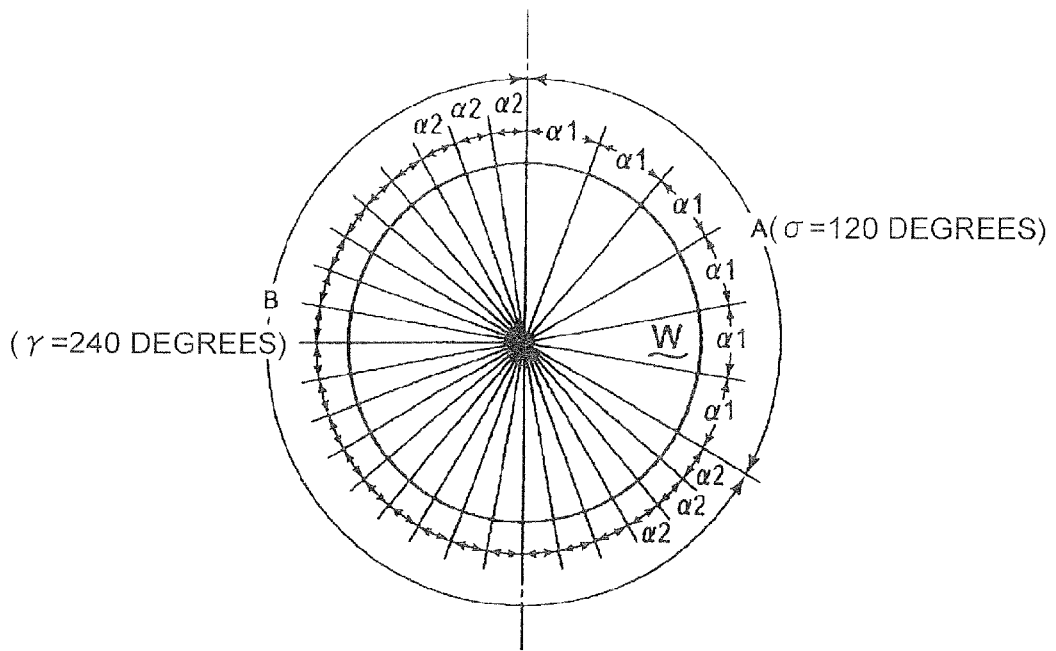
FIG. 13 is a diagram illustrating a specific example of a fifth embodiment.

A specific example of the fifth embodiment will now be described with reference to FIG. 13. In the example, an ALD film forming process is carried out by the equal division method initially at a division number K of 18 and a shift angle of 20°. It is assumed that while the initial processing achieves a target film thickness in the angular zone A having a central angle of 120°, the thickness of the film falls short of the target thickness in the angular zone B having a central angle of 240°.

Therefore, in order to improve the non-uniform film thickness, the density of the division number Kb per the central angle in the angular zone B is increased. The relationship between the division number Kb and the shift angle when d is increased from 1 to 2 is as follows:

By substituting δ=120°, γ=240°, α1=20° and Ka=120°/20°=6 into the expression (13), the following expression can be derived: 6/120=1/d×(Kb/240).

Therefore Kb=12d

Figure 14:
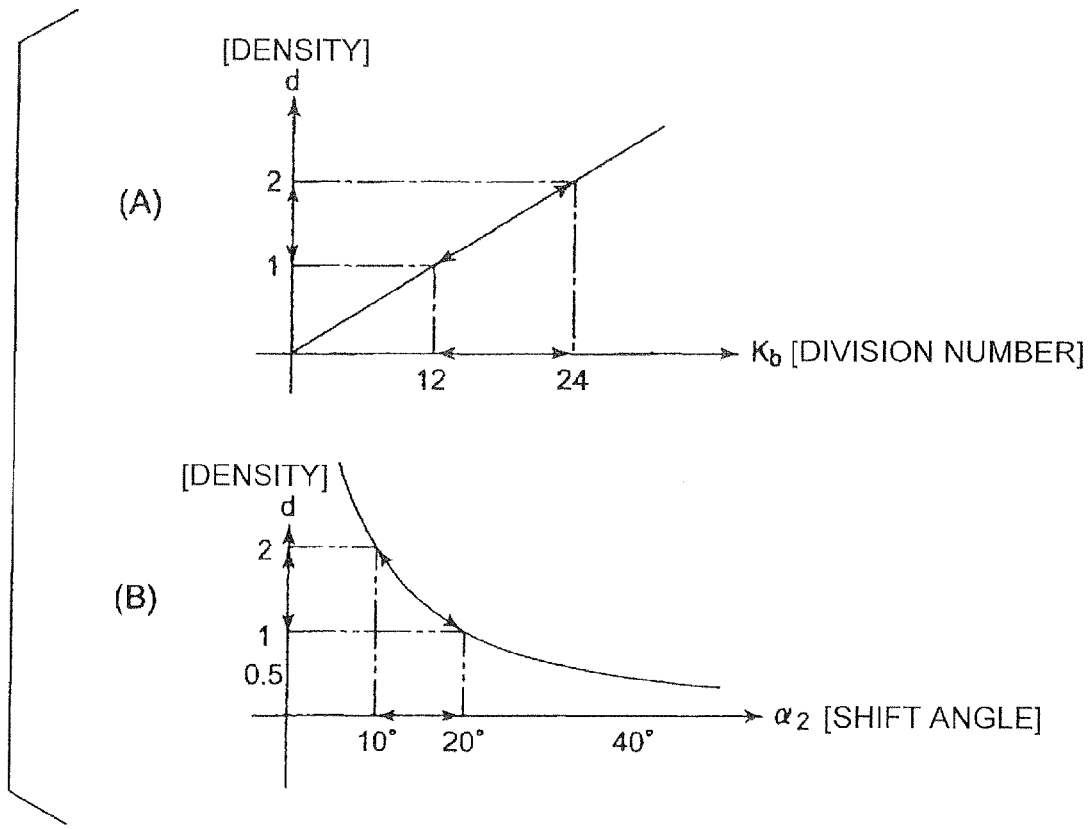
FIG. 14 is a diagram showing a relationship between a density d, a division number Kb and a shift angle α2.
Figure 15:
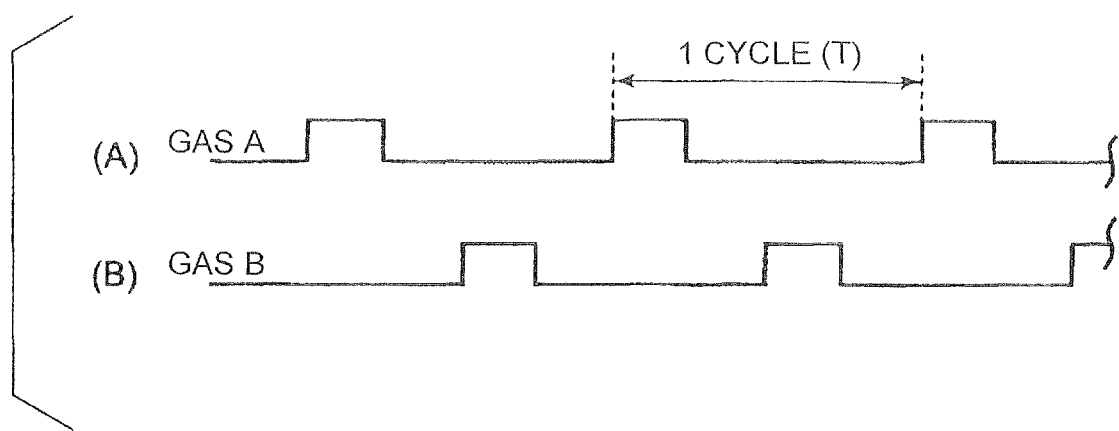
FIG. 15 is a diagram showing the common timing of supply of gases in an ALD process.

FIG. 14 shows a relationship between the density d, the division number Kb and the shift angle α2. FIG. 14(A) is a graph showing a linear function that indicates a relationship between d and Kb.

$$\alpha2=240°/Kb=240°/12d=20°/d$$

FIG. 14(B) is a graph showing a function that indicates a relationship between d and α2. The division number, i.e. the number of gas supply starting positions (gas supply starting directions), and the density d (the number of gas supply starting positions per unit angle) can thus be expressed as a continuous function in a specified angular range. It is therefore possible to set at least one basic density (number per unit angle) of gas supply starting positions in a particular angular region on a wafer, and to arbitrarily set a density (number per unit angle) of gas supply starting positions, which differs from the basic density, in an angular range other than the particular angular region.

Once the division number of an arbitrary angular zone is determined, the combination of T and N in the angular zone can be determined from the above expression (3) by changing the T×N value or one of T and N before an ALD film forming process is completed. This makes it possible to improve the in-plane uniformity of the thickness of a film formed on a wafer.

In summary, control is performed so that when the entire circumference of a substrate is divided into two angular zones A and B having central angles δ and γ, respectively, and when the density of the division number Ka per unit angle in the angular zone A is taken as 1, the density of the division number Kb per unit angle in the angular zone B is made d. The division numbers Ka, Kb can be determined as follows:

$$Ka+Kb=K \quad (11)$$

$$Ka/\delta:Kb/\gamma=1:d \rightarrow Ka/\delta=1/d\times(Kb/\gamma) \quad (13)$$

Therefore $Ka=1/d\times(Kb/\gamma)\times\delta$. By substituting this into the expression (11), the following expression is derived:

$$K=1/d\times(Kb/\gamma)\times\delta+Kb=Kb(1+\delta/\gamma d)$$

Therefore $Kb=d/(\delta/\gamma+d)\times K$, $Ka=1/(1+(\gamma/\delta)d)\times K$.

Once the division number Ka or Kb is determined, the combination of T and N in the angular zone can be determined from the above expression (3) by changing the T×N value or one of T and N before an ALD film forming process is completed. This makes it possible to provide an apparatus and method which can improve the in-plane uniformity of the thickness of a film formed on a wafer. The above-described calculations may be carried out by the control means 48. The number of the above-described angular zones, the specific division number of each zone and the specific shift angles α1, α2 in the respective zones are merely examples and are not limitative of the present invention. By performing such a control, the same advantageous effects as described above with reference to the preceding embodiments can be achieved.

The above-described calculations may be performed by inputting numerical values, which have been calculated by an operator, into the control means 48 comprised of a computer, or by inputting parameters into the control means 48 comprised of a computer, and causing the control means 48 to perform calculations based on the inputted data.

While the film forming apparatus which employs a plasma has been described, the present invention is of course applicable to a film forming apparatus which uses no plasma. While the film forming process using the two types of gases has been described, the present invention can be applied to a film forming process using a single gas or three or more types of gases. While the batch-type film forming apparatus has been described, the present invention can also be applied to a one-by-one film forming apparatus which processes wafers in a one-by-one manner.

Though DSC gas is used as a silane raw material gas in the above-described first embodiment, it is possible to use as a silane gas at least one gas selected from the group consisting of dichlorosilane (DSC), hexachlorosilane (HSC), monosilane [$SiH_4$], disilane [$Si_2H_6$], hexamethyldisilane (HMDS), tetrachlorosilane (TCS), disilylamine (DSA), trisilylamine (TSA) and bis(tertiary-butylamino)silane (BTBAS).

Though a nitriding gas, in particular $NH_3$ gas or $N_2$ gas, is used as an aid gas in the above-described embodiment, it is possible to use as an aid gas at least one gas selected from the group consisting of ammonia [$NH_3$], nitrogen [$N_2$], dinitrogen monoxide [$N_2O$] and nitric oxide [NO]. Instead of a nitriding gas, it is possible to use an oxidizing gas as an aid gas for the formation of a film.

A raw material gas other than a silane gas may also be used. For example, when an aluminum oxide ($Al_2O_3$) film is formed as a high-dielectric constant film, the film may be formed by using trimethylaluminum, known as TMA, as a raw material for aluminum, and repeating a processing cycle comprising converting TMA into $O_2$ and a plasma under the conditions of a substrate temperature of 200° C. and a reactor pressure of 3 Torr. In another example, a tantalum oxide ($Ta_2O_5$) film may be formed by using dimethylaminoethoxy tantalum tetraethoxide [$Ta(OC_2H_5)_4OCH_2CH_2N(CH_3)_2$], known as TAE, as a raw material for tantalum, and repeating a processing cycle comprising converting TAE into $O_2$ and a plasma under the conditions of a substrate temperature of 250° C. and a reactor pressure of 4 Torr.

Semiconductor wafers, usable as processing objects in the present invention, include a silicon substrate and a compound semiconductor substrate, such as a GaAs, SiC or GaN substrate. The present invention can also be applied to other substrates, such as a glass or ceramic substrate for use in a liquid crystal display device.

DESCRIPTION OF THE REFERENCE NUMERALS 2 film forming apparatus, 4 processing container, 12 wafer boat (holding means), 21 drive mechanism, 28 aid gas supply means, 30 raw material gas supply means, 32 purge gas supply means, 34 aid gas dispersing nozzle, 34A gas jet ports, 36 raw material gas dispersing nozzles, 36A gas jet ports, 48 control means, 48A processing condition input means, 50 activation means, 58 plasma electrodes, 60 high-frequency power source, 70 heating means, 80 nitriding gas supply means, auxiliary gas supply means, W semiconductor wafer (processing object)

The invention claimed is:

1. A film forming apparatus for forming an intended film on an object to be processed, comprising:
   a processing container configured to house the object to be processed;
   a gas supply means having a gas jet port configured to jet a gas toward the object to be processed;
   a holding means configured to hold the object to be processed in the processing container;
   a drive mechanism configured to rotate or periodically move the holding means relative to the gas jet port; and
   a control means configured to repeat a cycle, consisting of a supply period for supplying at least one gas and a supply stop period during which the supply of the gas is stopped, P times (P is a natural number greater than 1) while controlling the gas supply means so that a gas supply starting position is sequentially shifted in the circumferential direction of the object to be processed for every cycle in such a manner that the circumference of the object to be processed is divided into K segments (K=P), shift the gas supply starting position is shifted by one segment for every cycle, and adjust a rotation speed of the drive mechanism on a basis of the K segments and a cycle period which were inputted to the control means.

2. The film forming apparatus according to claim 1, wherein at least two gases, a gas A and a gas B, are supplied alternately in each cycle.

3. The film forming apparatus according to claim 1, wherein the rotational speed N (rpm) is not more than 240 times the reciprocal of the time (sec) for supply of a gas which is supplied for the longest time of those gases which contribute to the formation of the film.

4. The film forming apparatus according to claim 1, wherein the entire circumference of the object to be processed is equally divided into K segments.

5. The film forming apparatus according to claim 1, wherein the entire circumference of the object to be processed is unequally divided into K segments in a predetermined manner.

6. The film forming apparatus according to claim 1, wherein the processing container has a vertical cylindrical shape, the holding means is configured to hold a plurality of processing objects in multiple stages and to be capable of being inserted into and removed from the processing container, and the gas supply means includes a dispersing nozzle having a plurality of gas jet ports arranged in the longitudinal direction of the nozzle.

* * * * *